(12) United States Patent
Aoki et al.

(10) Patent No.: US 12,283,579 B2
(45) Date of Patent: Apr. 22, 2025

(54) DISPLAY DEVICE WITH GUARD RING

(71) Applicant: Japan Display Inc., Tokyo (JP)

(72) Inventors: Yoshinori Aoki, Tokyo (JP); Masanobu Ikeda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 842 days.

(21) Appl. No.: 17/359,657

(22) Filed: Jun. 28, 2021

(65) Prior Publication Data
US 2022/0037303 A1 Feb. 3, 2022

(30) Foreign Application Priority Data
Jul. 29, 2020 (JP) .................................. 2020-128157

(51) Int. Cl.
*H01L 29/12* (2006.01)
*H01L 23/60* (2006.01)
*H01L 25/16* (2023.01)
*H01L 29/786* (2006.01)

(52) U.S. Cl.
CPC ............ *H01L 25/167* (2013.01); *H01L 23/60* (2013.01)

(58) Field of Classification Search
CPC .................. H01L 25/167; H01L 23/60; H01L 29/0619–0623; G09G 2300/0413; G09G 2300/0426; G09G 2300/0452; G09G 2300/0819; G09G 2300/0842; G09G 3/32
See application file for complete search history.

(56) References Cited

U.S. PATENT DOCUMENTS

| | | | |
|---|---|---|---|
| 10,090,335 B2 | 10/2018 | Kang et al. | |
| 2016/0252793 A1* | 9/2016 | Cheng | H01L 29/78633 |
| | | | 257/72 |
| 2017/0213502 A1 | 7/2017 | Henry et al. | |
| 2018/0122836 A1* | 5/2018 | Kang | H01L 33/60 |
| 2018/0233533 A1* | 8/2018 | Kondo | H01L 29/36 |
| 2020/0035748 A1* | 1/2020 | Xia | H01L 27/156 |
| 2021/0043147 A1* | 2/2021 | Hao | H10K 59/131 |
| 2021/0068219 A1* | 3/2021 | Lee | G09G 3/2085 |
| 2021/0305314 A1* | 9/2021 | Su | H01L 25/0753 |
| 2023/0157095 A1* | 5/2023 | Xu | H10K 50/824 |
| | | | 257/40 |

FOREIGN PATENT DOCUMENTS

| | | |
|---|---|---|
| CN | 110190085 A | 8/2019 |
| JP | 2017-529557 A | 10/2017 |

* cited by examiner

*Primary Examiner* — Ismail A Muse
(74) *Attorney, Agent, or Firm* — XSENSUS LLP

(57) ABSTRACT

A display device includes a display region in which a plurality of pixel portions is arranged in a matrix on a substrate, each of the plurality of pixel portions including an LED chip, a transistor, and a capacitor. Through the transistor, a first electrode of the LED chip is connected to a first wiring to which one of power supply voltages is supplied. A second electrode of the LED chip is connected to a second wiring to which another of the power supply voltages is supplied. A first electrode of the capacitor is connected to the first electrode of the LED chip. The plurality of pixel portions includes at least one first pixel portion which is located on an outermost periphery of the display region and at least one second pixel portion which is not located on the outermost periphery of the display region.

15 Claims, 17 Drawing Sheets

219

DISPLAY DEVICE WITH GUARD RING

CROSS-REFERENCE TO RELATED APPLICATION

This application is based on and claims the benefit of priority from the prior Japanese Patent Application No. 2020-128157, filed on Jul. 29, 2020, the entire contents of which are incorporated herein by reference.

FIELD

One embodiment in the present invention relates to a display device, in particular, a display device on which micro LEDs are mounted.

BACKGROUND

In a small or medium-sized display device such as a smart phone, a display using a liquid crystal or an OLED (Organic Light Emitting Diode) have been commercialized. In particular, an OLED display device using the OLED, which is a self-light emitting element, has the advantages of high-contrast and no need for a backlight, as compared with a liquid crystal display device. However, since the OLED is composed of organic compounds, it is difficult to secure high reliability of the OLED display device due to deterioration of the organic compounds.

In recent years, a so-called micro LED display device and a mini LED display device in which minute LED chips are mounted in pixels of circuit substrate has been developed as a next-generation display device (for example, Japanese Patent Application Laid-Open No. 2017-528557 or U.S. patent Ser. No. 10/090,335). The LED is a self-light emitting element similar to the OLED, but unlike OLED, the LED is composed of stable inorganic compounds containing gallium (Ga) or indium (In), and therefore, the micro LED display device has high reliability as compared with the OLED display device. In addition, the LED chip has high light emission efficiency and high brightness can be realized. Therefore, the micro LED display device and mini LED display device are expected to be next-generation displays with high reliability, high brightness, and high contrast.

SUMMARY

A display device according to an embodiment of the present invention includes a display region in which a plurality of pixel portions is arranged in a matrix on a substrate, each of the plurality of pixel portions including an LED chip, a transistor supplying current to the LED chip, and a capacitor. Through the transistor, a first electrode of the LED chip is connected to a first wiring to which one of a high power supply voltage and a low power supply voltage is supplied. A second electrode of the LED chip is connected to a second wiring to which another of the high power supply voltage and the low power supply voltage is supplied. A first electrode of the capacitor is connected to the first electrode of the LED chip. The plurality of pixel portions includes at least one first pixel portion which is located on an outermost periphery of the display region and at least one second pixel portion which is not located on the outermost periphery of the display region. A second electrode of the capacitor in the at least one first pixel portion is connected to the second wiring A second electrode of the capacitor in the at least one second pixel portion is connected to the first wiring.

A display device according to an embodiment of the present invention includes a display region in which an LED chip is mounted on a substrate, a circuit region in which a drive circuit is provided outside the display region, and in a plan view, a guard ring between the display region and the circuit region.

A display device according to an embodiment of the present invention includes a display region provided with a pixel portion including a first pixel on which an LED chip is mounted on a substrate, a circuit region provided with a drive circuit of an LED chip outside the display region, and a dummy region provided with a pseudo pixel portion including a second pixel on which an LED chip is not mounted between the display region and the circuit region. A guard ring is provided in the dummy region so as to surround the pseudo pixel portion.

DESCRIPTION OF EMBODIMENTS

Figure 1:
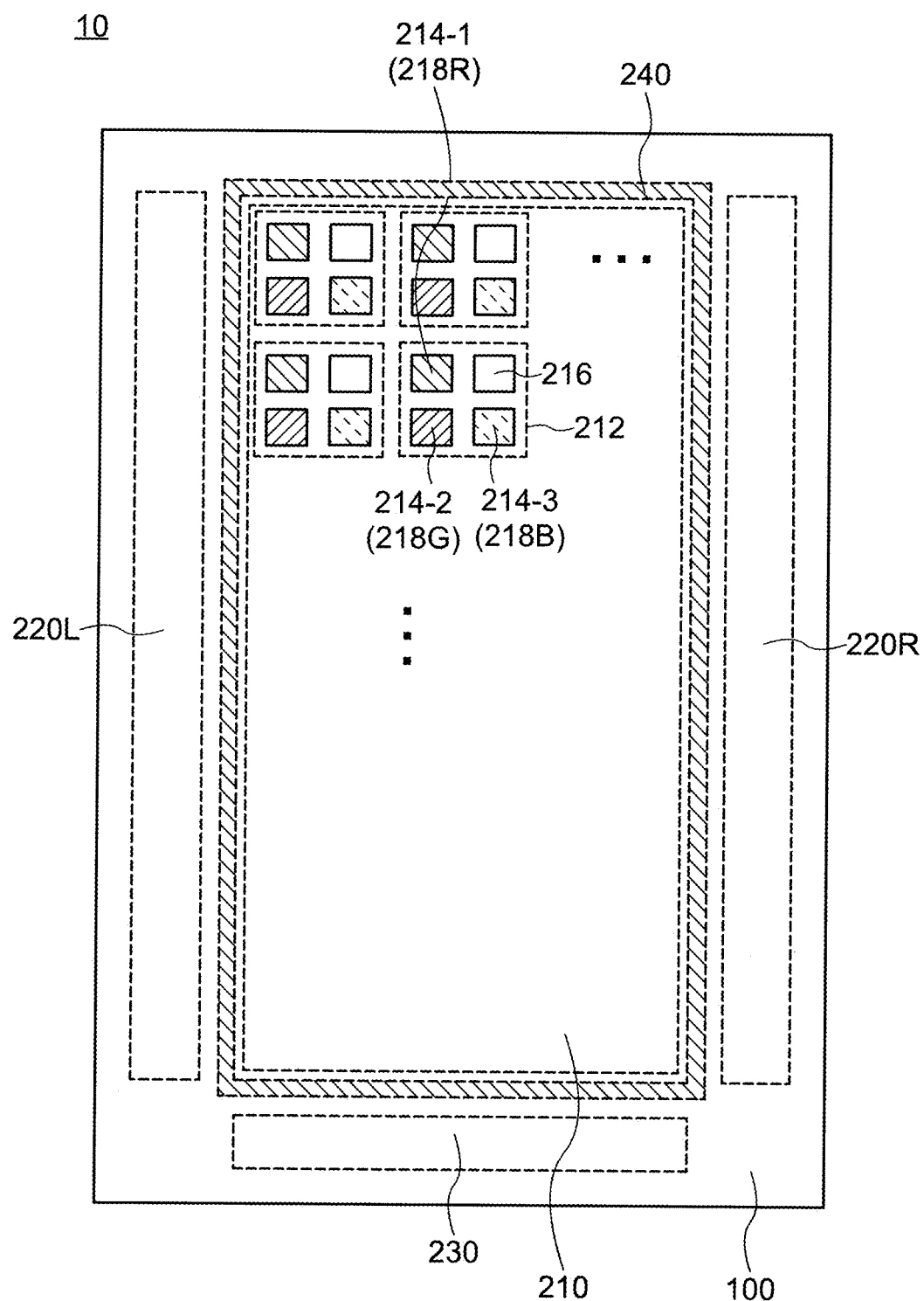
FIG. 1 is a schematic plan view of a display device according to an embodiment of the present invention.

Unlike an OLED display, a micro-LED and a mini-LED display have a step of mounting LED chips in their manufacturing method. In the pixel, a bonding layer is provided on a pixel electrode to mount the LED chip, and the LED chip is electrically connected to the pixel electrode by the bonding layer and fixed on the pixel electrode. However, electrostatic breakdown tends to occur during the bonding layer formation process or the LED chip mounting process in the manufacturing process of the micro LED display and the mini LED display. Since the LED chip have high brightness, it is difficult to laser repair the LED chip, unlike OLEDs. Therefore, the manufacturing process of micro-LED's and mini-LED's requires the suppression of electrostatic breakdown itself. In addition, most of the electrostatic breakdown occurred in the pixels located at the outermost periphery of the display region.

In view of the above problems, one of the objects of an embodiment of the present invention is to provide a display device having a structure in which electrostatic breakdown is unlikely to occur in the manufacturing process.

Hereinafter, embodiments of the present invention are described with reference to the drawings. Each of the embodiments is merely an example, and a person skilled in the art can easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

The expressions "α includes A, B or C", "a includes any of A, B and C", "a includes one selected from the group consisting of A, B and C", and "α includes one selected from the group consisting of A, B and C" do not exclude the case where a includes a plurality of combinations of A to C unless otherwise specified. Furthermore, these expressions do not exclude the case where α includes other elements.

In this specification, the phrase "above" or "above direction" or "below" or "below direction" is used for convenience of explanation, but in principle, the direction from a substrate toward a structure is referred to as "above" or "above direction" with reference to a substrate in which the structure is formed. Conversely, the directions from the structure to the substrate are "below" or "below direction". Therefore, in the expression of the structure over the substrate, one surface of the structure facing the substrate is the bottom surface of the structure and the other surface is the top surface of the structure. In addition, the expression "the structure over the substrate" only explains the vertical relationship between the substrate and the structure, and another member may be placed between the substrate and the structure. Furthermore, the terms "above" or "above direction" or "below" or "below direction" mean the order of stacked layers in the structure in which a plurality of layers are stacked, and may not be related to the position in which layers are superimposed in a plan view.

In this specification, "display device" is intended to include a wide range of devices that display a still image or moving image, and may include not only a display panel and a display module but also a device to which other optical members (for example, a polarizing member or touch panel, etc.) are attached.

The following embodiments may be combined with each other as long as there is no technical contradiction.

First Embodiment

A display device 10 according to an embodiment of the present invention is described while referring to FIGS. 1 to 8.

FIG. 1 is a schematic plan view of the display device 10 according to the embodiment of the present invention. Specifically, FIG. 1 is a block diagram showing a configuration of a plan layout of the display device 10.

As shown in FIG. 1, the display device 10 includes a circuit substrate 100. Further, the circuit substrate 100 includes a display region 210, a first circuit region 220L, a second circuit region 220R, a connection portion 230, and a dummy region 240. The display region 210 is provided in the central portion of the circuit substrate 100, and the first circuit region 220L, the second circuit region 220R, and the connection portion 230 are provided in the peripheral portion of the circuit substrate 100. In other words, the first circuit region 220L, the second circuit region 220R, and the connection portion 230 are located outside the display region 210. The dummy region 240 is located between the display region 210 and the first circuit region 220L or the second circuit region 220R in a plan view, and is provided so as to surround the display region 210.

The display region 210 includes a plurality of pixel portions 212. The plurality of pixel portions 212 is arranged in a matrix in the display region 210. Further, each of the plurality of pixel portions 212 includes a first pixel 214-1, a second pixel 214-2, a third pixel 214-3, and a connection pixel 216. The first pixel 214-1, the second pixel 214-2, and the third pixel 214-3 are pixels that contribute to the display itself. A red LED chip 218R, a green LED chip 218G, and a blue LED chip 218B are mounted in the first pixel 214-1, the second pixel 214-2, and the third pixel 214-3, respectively. The display device 10 can perform full-color display by controlling red light emission from the red LED chip 218R, green light emission from the green LED chip 218G, and blue light emission from the blue LED chip 218B. The arrangement of the red LED chip 218R, the green LED chip 218G, and the blue LED chip 218B in the pixel portion 212 is not limited to that shown in FIG. 1. The red LED chip 218R, the green LED chip 218G, and the blue LED chip 218B can be appropriately arranged in consideration of display quality, color balance, and the like. In the following, when the first pixel 214-1, the second pixel 214-2, and the third pixel 214-3 are not particularly distinguished, they are referred to as a pixel 214. Similarly, when the red LED chip 218R, the green LED chip 218G, and the blue LED chip 218B are not particularly distinguished, they are referred to as an LED chip 218.

Further, the pixel 214 is provided with a pixel circuit for controlling the LED chip 218. The pixel circuit is formed by a transistor or a capacitive element, or the like, and mainly controls the switching of the LED chip 218.

The LED chip 218 can emit light at least to a side opposite to the circuit substrate 100. When the LED chip 218 emits light not only to the circuit substrate 100 side but also to the side opposite to the circuit substrate 100 side, the display device 10 becomes a transparent LED display device capable of emitting light to both sides.

The size of the LED chip 218 is not particularly limited. The LED chip 218 may be appropriately selected in consideration of the size or resolution of the display device 10. For example, when the display device 10 is a small or medium-sized display device, a mini LED chip or a micro LED chip can be used.

The connection pixel 216 is a pixel for electrically connecting a cathode of the LED chip 218 to a wiring of the circuit substrate 100. After mounting the LED chip 218 on the circuit substrate 100, a conductive layer is formed on the LED chip 218, and the cathode of the LED chip 218 is connected to the connection pixel 216 via the conductive layer. In the display device 10, each of the plurality of pixel portions 212 is provided with a connecting portion for connecting the cathode of the LED chip 218. Depending on the structure of the LED chip 218, an anode of the LED chip 218 may be connected to the connection pixel 216. Hereinafter, for convenience, the cathode of the LED chip 218 is described as being connected to the connection pixel 216.

The dummy region 240 is provided with a pseudo pixel portion having a layout structure similar to that of the pixel portion 212. The LED chip 218 is not mounted in the dummy region 240. Therefore, a plurality of connection pixels 216 is formed in the pixel portion provided in the dummy region 240 instead of the pixels 214 in which the LED chips 218 are mounted. A detailed structure of the dummy region 240 is described later.

The first circuit region 220L and the second circuit region 220R include a driving circuit for driving transistors included in the pixel 214. The driving circuit is, for example, a scanning line driving circuit (gate driver circuit) or a signal line driving circuit (source driver circuit), or the like. In FIG. 1, although two circuit regions of the first circuit region 220L and the second circuit region 220R are provided, the number of circuit regions may be one or three or more.

The connection portion 230 is connected to the first circuit region 220L and the second circuit region 220R by a connection wiring (not shown). Further, the connection portion 230 is connected to an external device by flexible printed circuits (FPCs) or the like. That is, a signal from the external device is transmitted to the first circuit region 220L and the second circuit region 220R via the connection portion 230, and controls the LED chip 218 through the pixel circuit included in the pixel 214 of the display region 210. Here, the pixel circuit is described with reference to FIG. 2.

Figure 2:
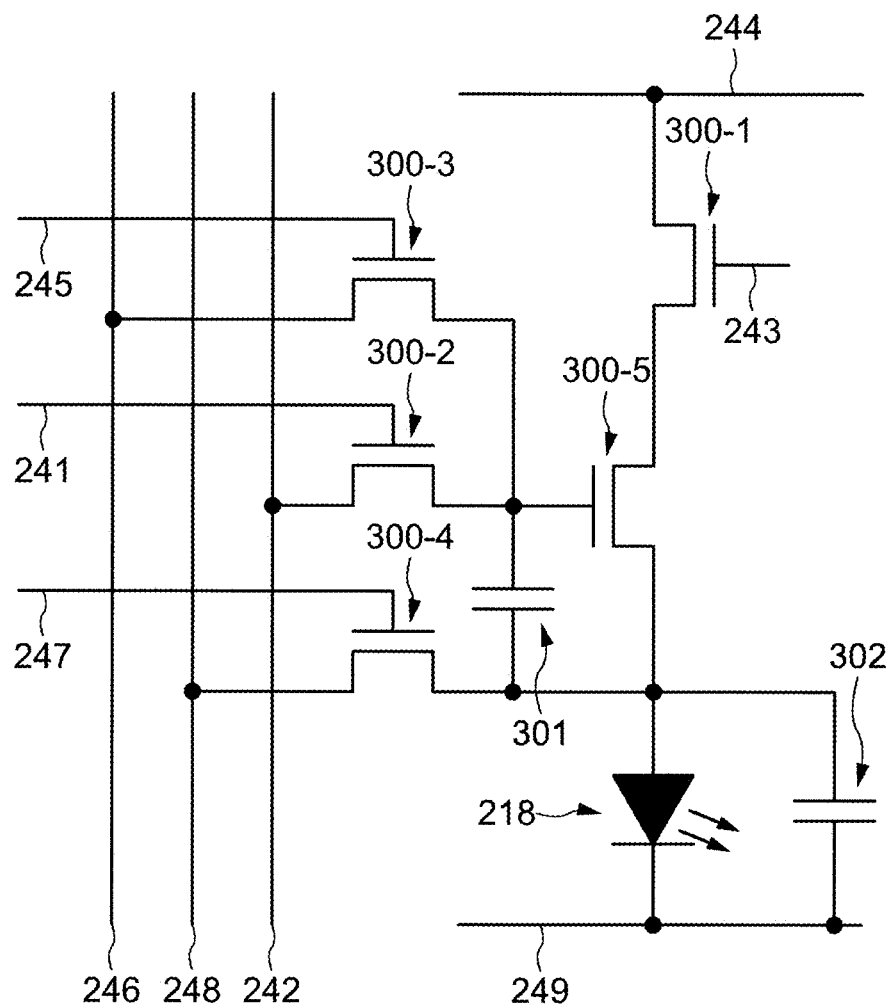
FIG. 2 is a circuit diagram showing a pixel circuit for driving an LED chip in a pixel of a display device according to an embodiment of the present invention.

FIG. 2 is a circuit diagram showing the pixel circuit for driving the LED chip 218 in the pixel 214 of the display device 10 according to the embodiment of the present invention.

As shown in FIG. 2, the pixel circuit of the pixel 214 includes the LED chip 218, a first transistor 300-1, a second transistor 300-2, a third transistor 300-3, a fourth transistor 300-4, a fifth transistor 300-5, a first capacitor 301, and a second capacitor 302. Further, the pixel circuit of the pixel includes a scan line 241, a signal line 242, a light emission control scan line 243, a current supply line 244, an initialization scan line 245, an initialization lines 246, a reset scan line 247, a reset line 248, and a cathode wiring 249. A high power supply voltage (PVDD) is applied to the current supply line 244, and a low power supply voltage (PVSS), which is lower than the high power supply voltage (PVDD), is applied to the cathode wiring 249.

In the following, when the first transistor 300-1, the second transistor 300-2, the third transistor 300-3, the fourth transistor 300-4, and the fifth transistor 300-5 are not particularly distinguished, they may be referred to as a transistor 300.

The anode (the first electrode) of the LED chip 218 is connected to the current supply line 244 via the first transistor 300-1 and the fifth transistor 300-5. On the other hand, the cathode (the second electrode) of the LED chip 218 is connected to the cathode wiring 249.

The first electrode of the second capacitor 302 is connected to the anode of the LED chip 218. On the other hand, the second electrode of the second capacitor 302 is connected to the cathode wiring 249.

The first transistor 300-1 is a light emission control transistor. The first transistor 300-1 is opened and closed by the light emission control scanning line 243, and selects whether or not to pass a current to the LED chip 218 and the fifth transistor 300-5.

The second transistor 300-2 is a selection transistor. The second transistor 300-2 is opened and closed by the scanning line 241, and applies the voltage supplied by the signal line 242 to the gate of the fifth transistor 300-5.

The third transistor 300-3 is an initialization transistor. The third transistor 300-3 is opened and closed by the initialization scanning line 245, and applies the predetermined voltage supplied by the initialization line 246 to the gate of the fifth transistor 300-5.

The fourth transistor 300-4 is a reset transistor. The fourth transistor 300-4 is opened and closed by the reset scanning line 247, and applies the reverse bias voltage supplied by the reset line 248 to the LED chip 218.

The fifth transistor 300-5 is a drive transistor. As described above, the potential of the gate of the fifth transistor 300-5 is determined based on the operation of the second transistor 300-2 or the third transistor 300-3. A current having a value determined based on the potential of the gate is supplied from the current supply line 244 to the LED chip 218.

Figure 3:
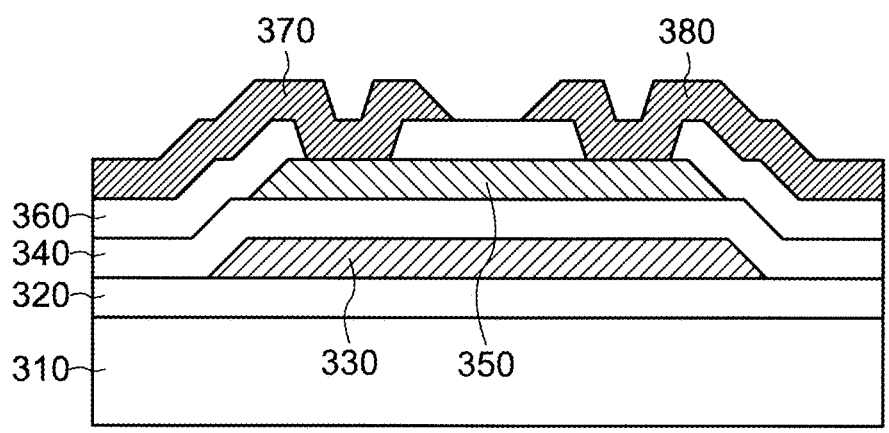
FIG. 3 is a cross-sectional view of a transistor provided over a circuit substrate of a display device according to an embodiment of the present invention.
Figure 4:
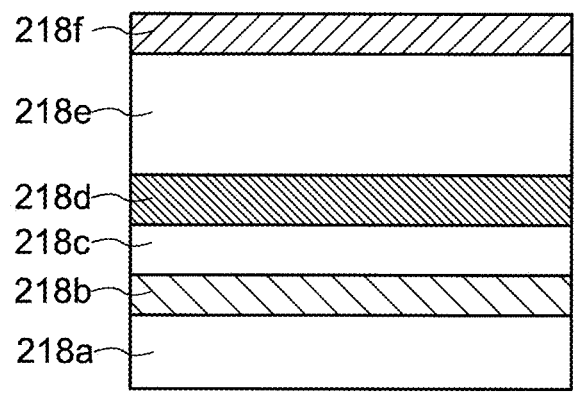
FIG. 4 is a cross-sectional view of an LED chip mounted in a pixel of a display device according to an embodiment of the present invention.

Structures of the transistor 300 and the LED chip 218 are described while referring to FIGS. 3 and 4.

FIG. 3 is a cross-sectional view of the transistor 300 provided over the circuit substrate 100 of the display device 10 according to the embodiment of the present invention;

As shown in FIG. 3, the transistor 300 is formed on the substrate 310. The transistor 300 includes a base film 320, a gate electrode layer 330, a gate insulating layer 340, a semiconductor layer 350, an interlayer insulating layer 360, a source electrode layer 370, and a drain electrode layer 380. The base film 320 is provided so as to cover the substrate 310. The gate electrode layer 330 is provided on the base film 320, and is covered with the gate insulating layer 340 provided on the gate electrode layer 330. The semiconductor layer 350 is provided on the gate insulating layer 340. The interlayer insulating layer 360 is provided on the semiconductor layer 350, and has an opening provided so that a part of the semiconductor layer 350 is exposed. The source electrode layer 370 and the drain electrode layer 380 are provided on the interlayer insulating layer 360, and each of the source electrode layer 370 and the drain electrode layer 380 is electrically connected to the semiconductor layer 350 via the opening of the interlayer insulating layer 360.

The transistor 300 shown in FIG. 3 is a so-called bottom gate type transistor. A top gate type transistor can also be used as the transistor 300.

The substrate 310 has a function of supporting the transistor 300. For example, a rigid substrate such as a glass substrate, a quartz substrate, or a sapphire substrate can be used as the substrate 310. Further, for example, a flexible substrate such as a polyimide substrate, an acrylic substrate, a siloxane substrate, or a fluororesin substrate can be used as the substrate 310. Impurities may be introduced into the flexible substrate in order to improve the heat resistance of the flexible substrate. Further, when the substrate 310 does not require translucency, for example, a silicon substrate, a silicon carbide substrate, a semiconductor substrate such as a compound semiconductor substrate, or a conductive substrate such as a stainless steel substrate can be used as the substrate 310.

The base film 320 can prevent impurities from entering the transistor 300 from the substrate 310. For example, silicon oxide, silicon nitride, aluminum oxide, aluminum nitride, or the like can be used as the material of the base film 320. Further, the base film 320 may be a single layer or a laminated layer. The transistor 300 may be configured so that the base film 320 is not provided.

For example, a metal such as aluminum (Al), titanium (Ti), molybdenum (Mo), copper (Cu), or tungsten (W), or an alloy thereof can be used as the material of the gate electrode layer 330. Further, the gate electrode layer 330 may be a single layer or a laminated layer.

For example, silicon oxide, silicon nitride, aluminum oxide, or aluminum nitride can be used as the material of the gate insulating layer 340. Further, the gate insulating layer 340 can be a single layer or a laminated layer.

For example, silicon such as amorphous silicon or polysilicon, or an oxide semiconductor such as zinc oxide (ZnO), gallium oxide ($Ga_2O_3$), or indium gallium oxide zinc (IGZO) can be used as the material of the semiconductor layer 350. The semiconductor layer 350 can include not only a channel forming region but also a source region or a drain region (a high-concentration impurity region). The semiconductor layer 350 can include a low concentration impurity region between the channel formation region and the source region or drain region.

For example, silicon oxide, silicon nitride, aluminum oxide, or aluminum nitride can be used as the material of the interlayer insulating layer 360. Further, the interlayer insulating layer 360 may be a single layer or a laminated layer.

For example, a metal such as aluminum (Al), titanium (Ti), molybdenum (Mo), copper (Cu), or tungsten (W), or an alloy thereof can be used as the material of the source electrode layer 370 and the drain electrode layer 380. Further, each of the source electrode layer 370 and the drain electrode layer 380 can be a single layer or a laminated layer. The functions of the source electrode layer 370 and the drain electrode layer 380 may be interchanged.

FIG. 4 is a cross-sectional view of the LED chip 218 mounted in the pixel 214 of the display device 10 according to the embodiment of the present invention. As shown in FIG. 4, the LED chip 218 includes a substrate 218a, a cathode 218b, an n-type semiconductor layer 218c, a light emitting layer 218d, a p-type semiconductor layer 218e, and an anode 218f.

The substrate 218a can support each layer provided over the substrate 218a. Further, the substrate 218a is preferably a substrate on which the p-type semiconductor layer 218e, the light emitting layer 218d, and the n-type semiconductor layer 218c can grow crystals. For example, a sapphire substrate, a silicon carbide substrate, a silicon substrate, a gallium nitride substrate, or the like can be used as the substrate 218a.

When the LED chip 218 is a red LED chip, the material of the light emitting layer 218d includes aluminum, gallium, indium, and phosphorus. The composition ratio of aluminum, gallium, and indium is typically, but not limited to, aluminum:gallium:indium=0.225:0.275:0.5. Further, the material of the light emitting layer 218d may be a compound containing indium, gallium, and nitrogen. In this case, the composition ratio of indium to gallium is typically, but not limited to, indium:gallium=0.65:0.35. Further, the material of the light emitting layer 218d may be gallium nitride. Each of the n-type semiconductor layer 218c and the p-type semiconductor layer 218e is, for example, aluminum phosphide indium.

When the LED chip 218 is a green LED chip, the material of the light emitting layer 218d includes indium, gallium, and nitrogen. The composition ratio of indium to gallium is typically, but not limited to, indium:gallium=0.44:0.55. Further, each of the n-type semiconductor layer 218c and the p-type semiconductor layer 218e is, for example, gallium nitride.

When the LED chip 218 is a blue LED chip, the material of the light emitting layer 218d includes indium, gallium, and nitrogen. The composition ratio of indium to gallium is typically, but not limited to, indium:gallium=0.2:0.8. Further, each of the n-type semiconductor layer 218c and the p-type semiconductor layer 218e is gallium nitride.

Although aluminum can be used for the cathode 218b and the anode 218f in any of the red LED chip 218R, the green LED chip 218G, and the blue LED chip 218B, the cathode 218b and the anode 218f are not limited to this.

The maximum emission wavelengths of the red LED chip 218R, the green LED chip 218G, and the blue LED chip 218B are typically 645 nm, 530 nm, and 450 nm, respectively.

The cathode 218b is formed on the substrate 218a, an n-type semiconductor layer 218c, a light emitting layer 218d, and a p-type semiconductor layer 218e are crystal grown, and then an anode 218f is formed to form the LED chip 218. Further, the substrate 218a is diced and separated into individual LED chips 218.

The LED chip 218 mounted on the display device 10 is not limited in size, and for example, a mini LED chip or a micro LED chip can be used as the LED chip 218.

The LED chip 218 shown in FIG. 4 has a so-called vertical LED structure (a vertical electrode structure) having a light emitting layer 218d between the cathode 218b and the anode 218f. However, the LED chip 218 of the display device 10 is not limited to the vertical LED structure. A horizontal LED structure (a horizontal electrode structure) can also be used for the LED chip 218. In the following explanation, a horizontal LED structure is described with reference to FIG. 5.

Figure 5:
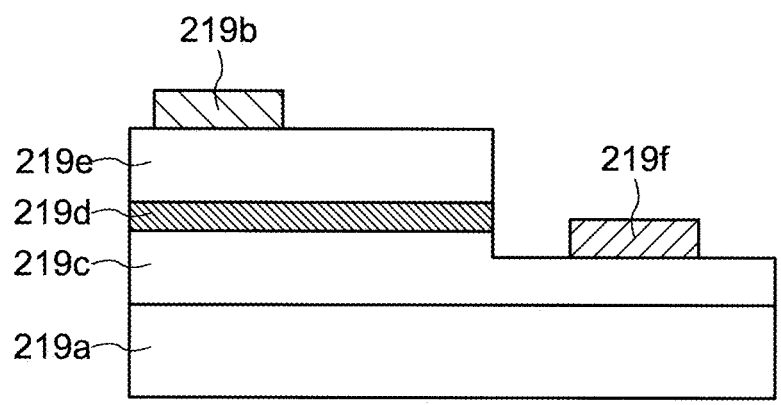
FIG. 5 is a cross-sectional view of an LED chip mounted in a pixel of a display device according to an embodiment of the present invention.

FIG. 5 is a cross-sectional view of an LED chip 219 mounted in the pixel 214 of the display device 10 according to the embodiment of the present invention. As shown in FIG. 5, the LED chip 219 includes a substrate 219a, an anode 219b, an n-type semiconductor layer 219c, a light emitting layer 219d, a p-type semiconductor layer 219e, and a cathode 219f. The LED chip 219 has a so-called horizontal LED structure.

The LED chip 219 is formed by crystal growing an n-type semiconductor layer 219c, a light emitting layer 219d, and a p-type semiconductor layer 219e on a substrate 219a, and then forming an anode 219b and a cathode 219f. Further, although not shown, bumps may be formed on the anode 219b and the cathode 219f, respectively. The bumps serve as electrodes for connecting to the circuit substrate 100, and a height of the LED chip 219 can be adjusted. That is, when the height of the surface of the anode 219b and the height of the surface of the cathode 219f are different, the height of the LED chip 219 can be adjusted by using the bumps. The bumps can be formed by plating, sputtering, vapor deposition, printing, or the like. When forming bumps by plating, for example, gold can be used as the material of the bumps. However, the material of the bump is not limited to this. Finally, the substrate 219a is diced and separated into individual LED chips 219. The LED chip 219 is mounted on the circuit substrate 100 by flip chip bonding.

The structure of the LED chip 219 is not limited to the configuration shown in FIG. 5. For example, the anode 219b and the cathode 219f can be omitted, and the bumps can be formed on the p-type semiconductor layer 219e and the n-type semiconductor layer 219c, respectively.

The size of the LED chip 219 is not limited, and for example, a mini LED chip or a micro LED chip can be used as the LED chip 219.

Next, the structure of the pixel portion 212 is described with reference to FIG. 6.

Figure 6:
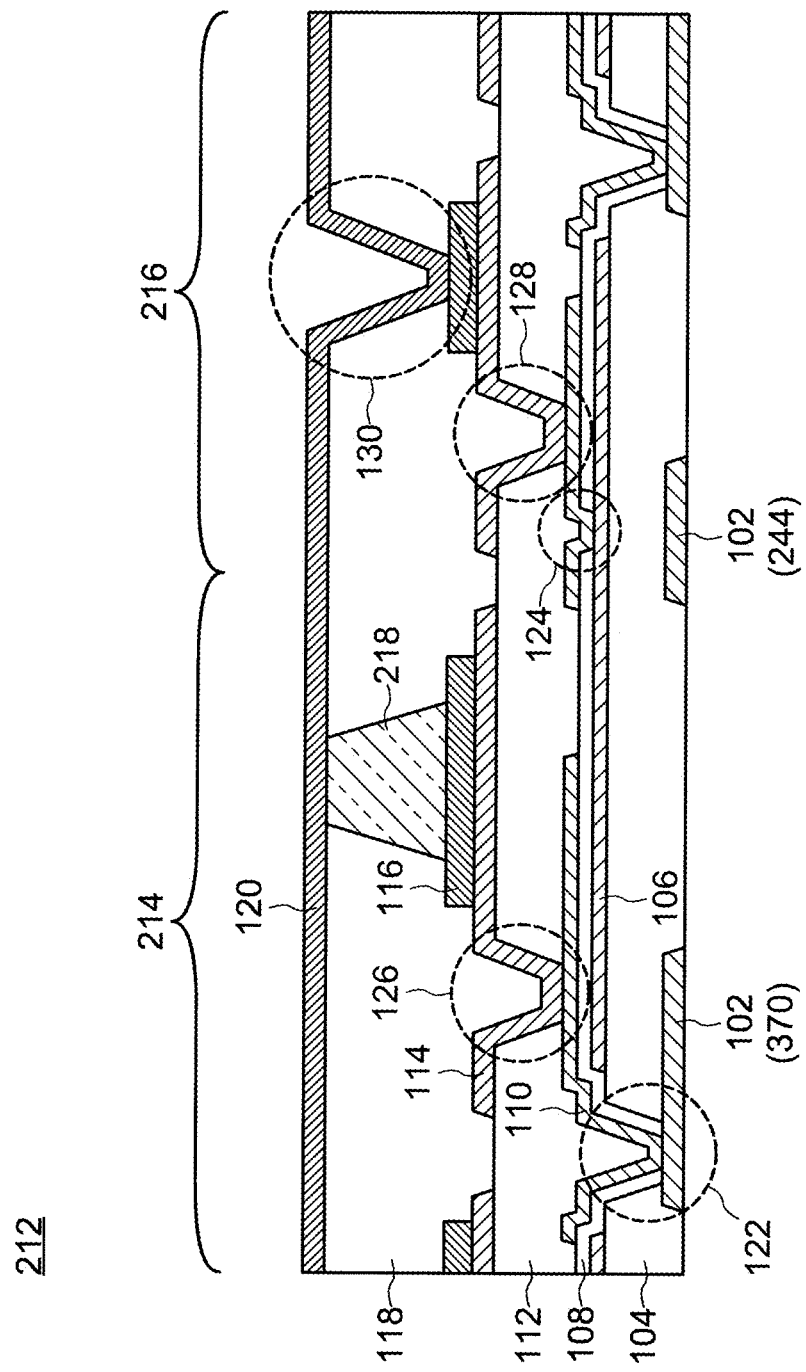
FIG. 6 is a cross-sectional view of a pixel portion of a display device according to an embodiment of the present invention.

FIG. 6 is a cross-sectional view of the pixel portion 212 of the display device 10 according to the embodiment of the present invention. Specifically, FIG. 6 shows the cross-sectional view of the pixel 214 and the connection pixel 216 of the pixel portion 212. In the pixel portion 212 shown in FIG. 6, the structure of the transistor 300 is omitted, and the structure over the transistor 300 is shown.

As shown in FIG. 6, the pixel portion 212 includes a first conductive layer 102, a first flattening layer 104, a second conductive layer 106, a first insulating layer 108, a third conductive layer 110, a second flattening layer 112, a fourth conductive layer 114, a fifth conductive layer 116, an LED chip 218, a third flattening layer 118, and a sixth conductive layer 120. In FIG. 6, the same reference numerals are used for the layers that are formed in the same manner. However, in the pixel 214 and the connection pixel 216, it is not necessary that the layers having the same reference numerals are electrically connected.

The first flattening layer 104 is provided on the first conductive layer 102. In the pixel 214, the first flattening layer 104 has an opening 122 in which a part of the first conductive layer 102 is exposed. The second conductive layer 106, the first insulating layer 108, and the third conductive layer 110 are provided over the first flattening layer 104 in this order. In pixel 214, the third conductive layer 110 is electrically connected to the first conductive layer 102 via the opening 122. Further, in the connection pixel 216, the first insulating layer 108 has an opening 124 in which a part of the second conductive layer 106 is exposed. The third conductive layer 110 is electrically connected to the second conductive layer 106 via the opening 124.

The second flattening layer 112 is provided on the third conductive layer 110 and has an opening 126 in the pixel 214 and an opening 128 in the connection pixel 216. A part of the third conductive layer 110 is exposed in the opening 126 and the opening 128. The fourth conductive layer 114 and the fifth conductive layer 116 are provided over the second flattening layer 112 in this order. In the pixel 214, the fourth conductive layer 114 is electrically connected to the third conductive layer 110 via the opening 126. Further, in the connection pixel 216, the fourth conductive layer 114 is electrically connected to the third conductive layer 110 via the opening 128. The LED chip 218 is mounted on the fifth conductive layer 116.

The third flattening layer 118 is provided so that the LED chip 218 is embedded in the third flattening layer 118. Further, the third flattening layer 118 has an opening 130 in which a part of the fifth conductive layer 116 is exposed in the connection pixel 216. The sixth conductive layer 120 is provided on the third flattening layer 118 and is electrically connected to the fifth conductive layer 116 via the opening 130.

The first conductive layer 102 can function as the source electrode layer 370 of the transistor 300 or a current supply line 244, or the like. For example, a metal such as aluminum (Al), titanium (Ti), molybdenum (Mo), copper (Cu), or tungsten (W), or an alloy thereof can be used as the material of the first conductive layer 102. Further, the first conductive layer 102 may be a single layer or a laminated layer.

The second conductive layer 106 is a wiring layer for supplying a low power supply voltage (PVSS) from the outside of the display region 210. For example, a transparent conductive material such as indium tin oxide (ITO) or indium zinc oxide (IZO) can be used as the material of the second conductive layer 106.

The third conductive layer 110 can function as a wiring layer for connecting the first conductive layer 102 and the fourth conductive layer 114. For example, a metal such as aluminum (Al), titanium (Ti), molybdenum (Mo), copper (Cu), or tungsten (W), or an alloy thereof can be used as the material of the third conductive layer 110. Further, the first conductive layer 102 may be a single layer or a laminated layer.

The fourth conductive layer 114 can function as an electrode pad for mounting the LED chip 218. Further, the fourth conductive layer 114 can function as a reflective layer that reflects the light emitted from the LED chip 218. For example, a metal such as aluminum (Al), titanium (Ti), molybdenum (Mo), copper (Cu), or tungsten (W), or an alloy thereof can be used as the material of the fourth conductive layer 114. Further, the first conductive layer 102 may be a single layer or a laminated layer.

The fifth conductive layer 116 can function as a bonding layer for bonding the LED chips 218. For example, silver paste, solder, or anisotropic conductive film (ACF) can be used for the fifth conductive layer 116, The sixth conductive layer 120 can function as a wiring layer for connecting the cathode of the LED chip 218. Further, the sixth conductive layer 120 can function as a transmission layer that transmits light emitted from the LED chip 218. For example, a transparent conductive oxide such as indium tin oxide (ITO) or indium zinc oxide (IZO) can be used as the material of the sixth conductive layer 120.

In the pixel 214, the first insulating layer 108 can separate and electrically insulate the second conductive layer 106 and the third conductive layer 110. For example, silicon oxide ($SiO_x$), silicon nitride ($SiO_xN_y$), silicon nitride ($SiN_x$), silicon nitride ($SiN_xO_y$), aluminum oxide ($AlO_x$), and aluminum nitride ($AlO_xN_y$). Inorganic insulating materials such as aluminum nitride ($AlN_xO_y$) or aluminum nitride ($AlN_x$) can be used as the material of the first insulating layer 108. Here, $SiO_xN_y$ and $AlO_xN_y$ are silicon compounds and aluminum compounds containing nitrogen (N) in an amount smaller than oxygen (O). Further, $SiN_xO_y$ and $AlN_xO_y$ are silicon compounds and aluminum compounds containing oxygen in an amount smaller than that of nitrogen. Further, not only an inorganic insulating material but also an organic insulating material can be used as the material of the first insulating layer 108. For example, a polyimide resin, an acrylic resin, an epoxy resin, a silicone resin, a fluororesin, a siloxane resin, or the like can be used as the organic insulating material. The first insulating layer 108 may be a single layer or a laminated layer. Further, when the first insulating layer 108 is the laminated layer, the inorganic insulating material and the organic insulating material may be used.

The first flattening layer 104 and the second flattening layer 112 can flatten the unevenness of the layers located below each of the first flattening layer 104 and the second flattening layer 112. For example, an organic resin such as polyimide resin, acrylic resin, epoxy resin, silicone resin, fluororesin, or siloxane resin can be used as the material of each of the first flattening layer 104 and the second flattening layer 112. Each of the first flattening layer 104 and the second flattening layer 112 may be a single layer or a laminated layer.

In forming the sixth conductive layer 120, the third flattening layer 118 can be flattened by reducing the step with the LED chip 218. For example, a photosensitive organic material such as photosensitive acrylic or photosensitive polyimide, or silicone resin can be used as the material of the third flattening layer 118.

In the connection pixel 216, the second conductive layer 106 is not electrically connected to the first conductive layer 102. On the other hand, the second conductive layer 106 is electrically connected to the sixth conductive layer 120 which is connected to the cathode of the LED chip 218 via the third conductive layer 110. Therefore, in the connection pixel 216, a low power supply voltage (PVSS) supplied to the cathode of the LED chip 218 is applied to the second conductive layer 106 and the third conductive layer 110.

On the other hand, in the pixel 214, the third conductive layer 110 is electrically connected to the first conductive layer 102. The first conductive layer 102 is the source electrode layer 370 of the transistor 300. Therefore, a high power supply voltage (PVDD) supplied to the anode of the LED chip 218 is applied to the third conductive layer 110 via the transistor 300. Further, the second capacitor 302 shown in FIG. 2 is formed in the pixel 214. That is, the first electrode of the second capacitor 302 is the third conductive layer 110, and the second electrode of the second capacitor 302 is the second conductive layer 106.

A structure of a pixel portion 812 is described with reference to FIG. 11.

Figure 11:
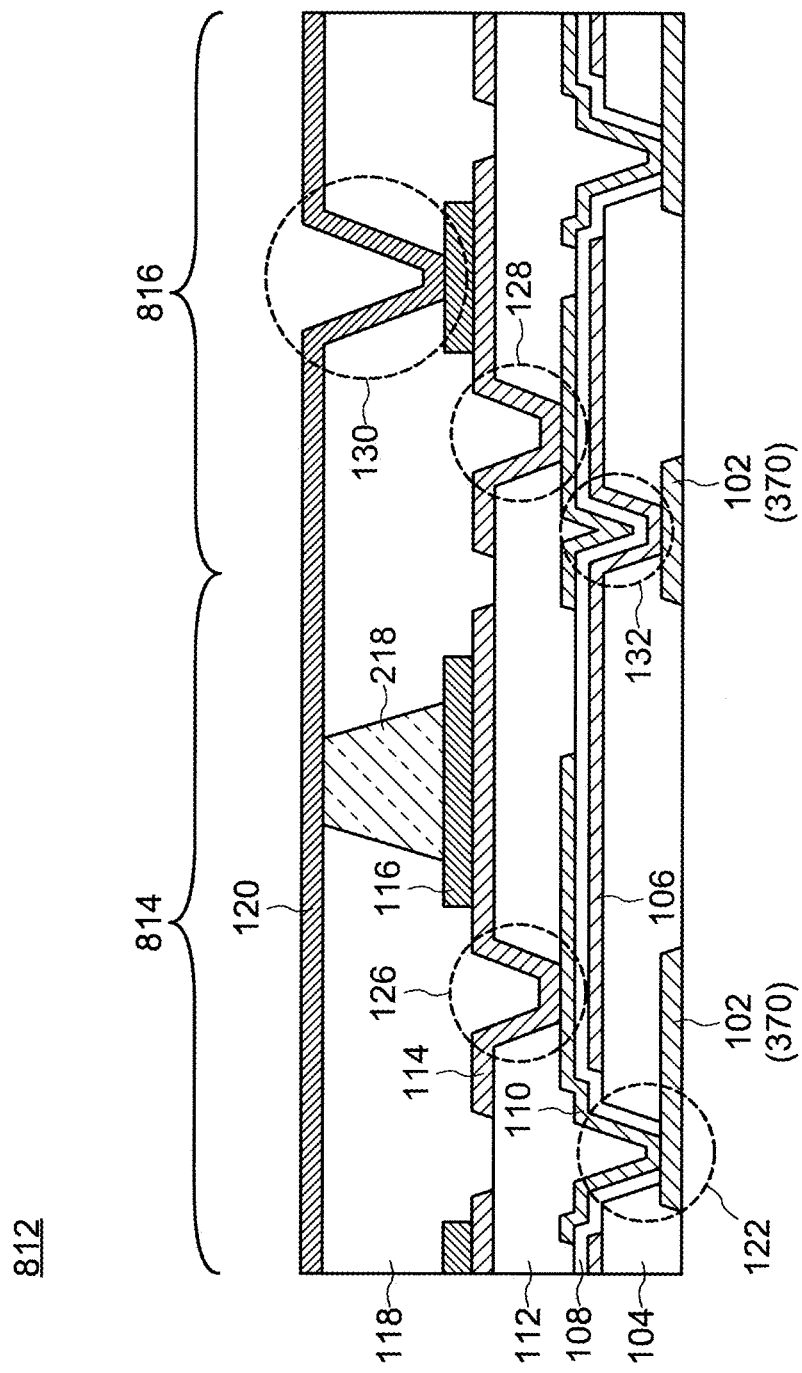
FIG. 11 is a comparative example of a cross-sectional view of a pixel portion of a display device.

FIG. 11 is a comparative example of a cross-sectional view of the pixel portion 812 of the display device. When the structure of the pixel portion 812 is the same as the structure of the pixel portion 212 described above, the description is omitted, and the structure different from that of the pixel portion 212 is mainly described in the following explanation.

As shown in FIG. 11, the pixel portion 812 including a pixel 814 and a connection pixels 816 includes the first conductive layer 102, the first flattening layer 104, the second conductive layer 106, the first insulating layer 108, the third conductive layer 110, the second flattening layer 112, the fourth conductive layer 114, the fifth conductive layer 116, the LED chip 218, the third flattening layer 118, and the sixth conductive layer 120.

In the connection pixel 816, the first flattening layer 104 has an opening 132 in which a part of the first conductive layer 102 is exposed. The second conductive layer 106 is electrically connected to the first conductive layer 102 via the opening 132. That is, a high power supply voltage (PVDD) supplied to the current supply line 244 is applied to the second conductive layer 106. On the other hand, the second conductive layer 106 is insulated from the third conductive layer 110 by the first insulating layer 108. The third conductive layer 110 is electrically connected to the sixth conductive layer 120 which is connected to the cathode of the LED chip 218. Therefore, a low power supply voltage (PVSS) supplied to the cathode is applied to the third conductive layer 110.

Figure 12:
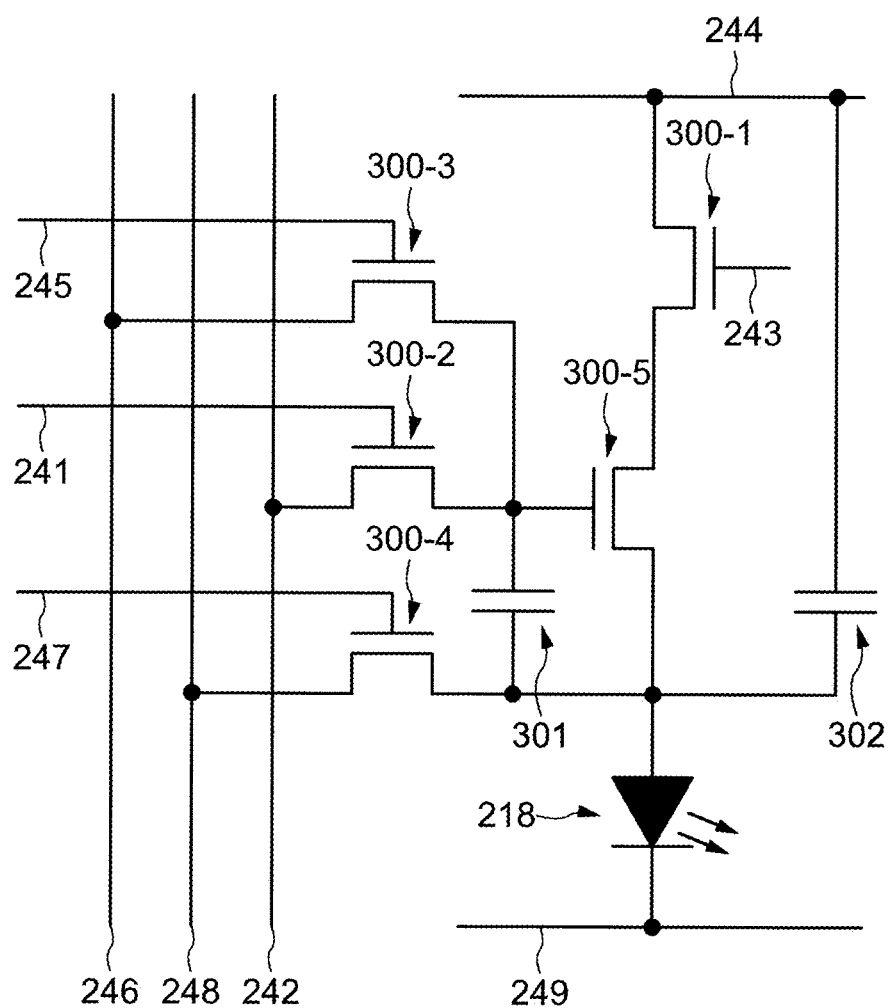
FIG. 12 is a circuit diagram showing a pixel circuit for driving an LED chip in a pixel portion of a comparative example shown in FIG. 11.

FIG. 12 is a circuit diagram showing a pixel circuit for driving the LED chip 218 in the pixel portion 812 of the comparative example shown in FIG. 11. Unlike the pixel circuit shown in FIG. 2, the first electrode of the second capacitor 302 is connected to the anode of the LED chip 218. Further, unlike the pixel circuit shown in FIG. 2, the second electrode of the second capacitor 302 is connected to the current supply line 244. As shown in FIG. 11, the second capacitor 302 is formed in the connection pixel 816. That is, the first electrode of the second capacitor 302 is the second conductive layer 106, and the second electrode of the second capacitor is the third conductive layer 110.

In the pixel portion 812, different power supply voltages are applied to the second conductive layer 106 and the third conductive layer 110 with the first insulating layer 108 interposed therebetween. The film thickness of the first insulating layer 108 is not so large. Therefore, if the potential difference between the second conductive layer 106 and the third conductive layer 110 becomes large, electrostatic breakdown occurs in the first insulating layer 108.

On the other hand, in the pixel portion 212 of the display device 10 according to the present embodiment, the same voltage is applied to the second conductive layer 106 and the third conductive layer 110. Therefore, the potential difference between the second conductive layer 106 and the third conductive layer 110 does not increase, and electrostatic breakdown of the first insulating layer 108 is unlikely to occur.

Therefore, in the display device 10 according to the present embodiment, the same power supply voltage is applied to the adjacent conductive layers with at least an insulating layer having a small film thickness sandwiched between the adjacent conductive layers. As a result, electrostatic breakdown of the pixel portion 212 can be prevented in the entire display region 210.

For example, the configuration shown in FIG. 6 is applied to the pixel portion 212 located on the outermost periphery of the plurality of pixel portions 212 arranged in the display region 210 shown in FIG. 1, and the configuration shown in FIG. 11 may be applied to the pixel portions 212 located inside the outermost periphery of the plurality of pixel portions 212. Such a configuration can be realized by changing the shape of the second conductive layer 106 and the locations of the opening 124 and the opening 128. Electrostatic breakdown of the pixel portion 212 is particularly likely to occur in the pixel portion 212 located on the outermost periphery of the display portion 210. Therefore, even if the configuration shown in FIG. 6 is applied to the pixel portion 212 located at least on the outermost periphery of the plurality of pixel portions 212, electrostatic breakdown of the pixel portion 212 can be sufficiently prevented. Further, in such a configuration, the second electrodes of the capacitors included in the pixel portion 212 located on the outermost periphery of the plurality of pixel portions 212 may be electrically connected to each other and provided so as to surround the pixel portions 212 located inside the outermost periphery of the plurality of pixel portions 212.

Further, in the dummy region 240 surrounding the display region 210, a pseudo pixel portion having a layout structure similar to the pixel portion 212 is provided. By providing the pseudo pixel portion in the dummy region 240, it is possible to create a situation in which the pixel portion 212 located at the outermost periphery of the display region 210 exists in the dummy region 240. Therefore, control is possible so that the electrostatic breakdown which occurred in the pixel portion 212 located on the outermost periphery of the display region 210 is generated in the dummy region 240.

Therefore, since electrostatic breakdown does not occur in the display region 210, defects due to electrostatic breakdown are suppressed in the display device 10. In this case, the display region 210 is surrounded by the dummy region 240. Since electrostatic breakdown is suppressed by providing the dummy region 240, the pixel portion 212 located on the outermost periphery of the plurality of pixel portions 212 may have the configuration shown in FIG. 11.

Next, a configuration of a pseudo pixel portion 212D in the dummy region 240 is described with reference to FIGS. 7A to 7F.

FIGS. 7A to 7F are schematic plan views showing a method for manufacturing the display device according to the embodiment of the present invention. Specifically, FIGS. 7A to 7F show plan views of the display region 210 and the dummy region 240.

Figure 7A:
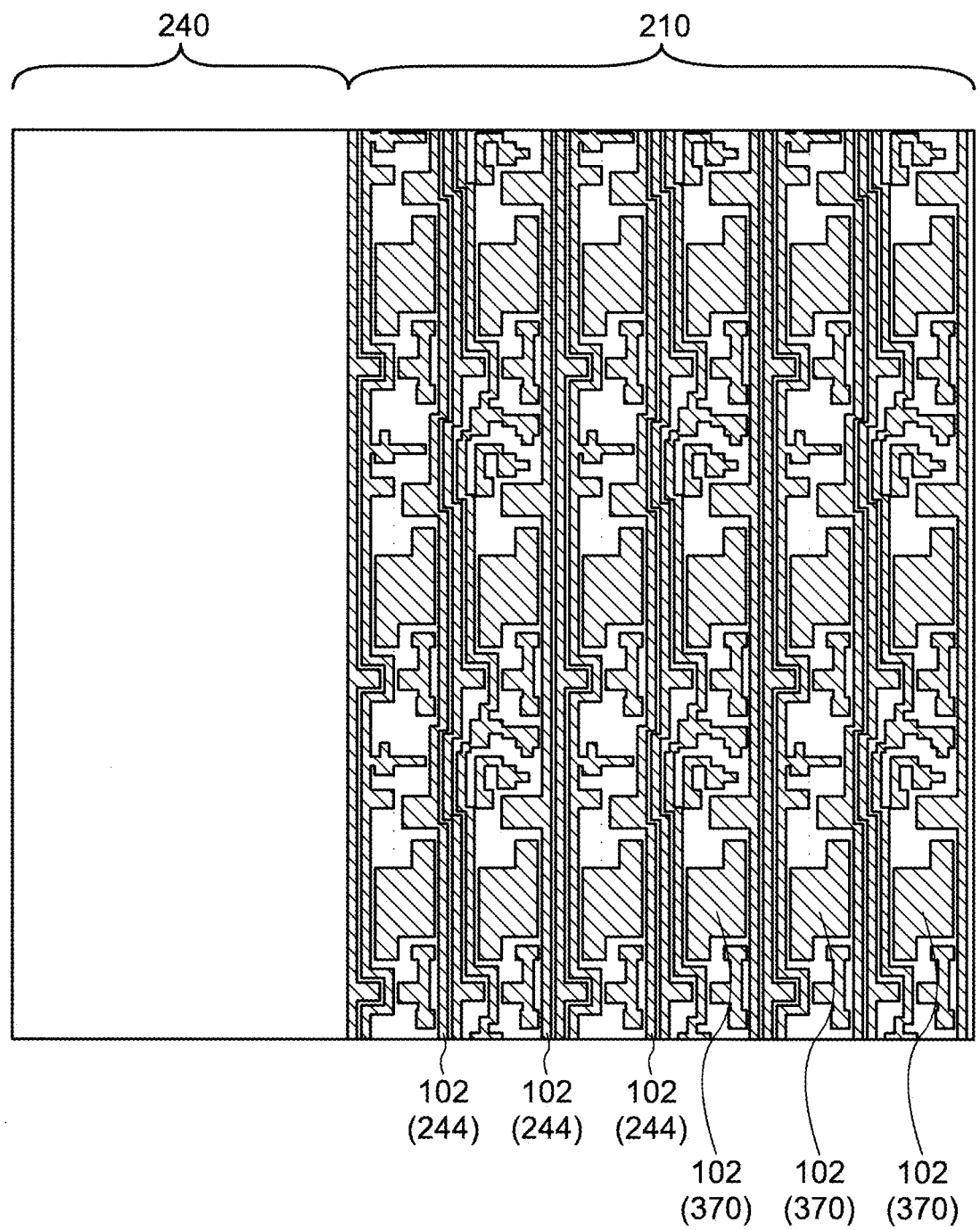
FIG. 7A is a schematic plan view showing a method for manufacturing a display device according to an embodiment of the present invention.

FIG. 7A shows a patterned first conductive layer 102. The first conductive layer 102 is formed only in the display region 210, not in the dummy region 240. The current supply line 244 or the source electrode layer 370 is formed as the first conductive layer 102 in the display region 210, for example.

Figure 7B:
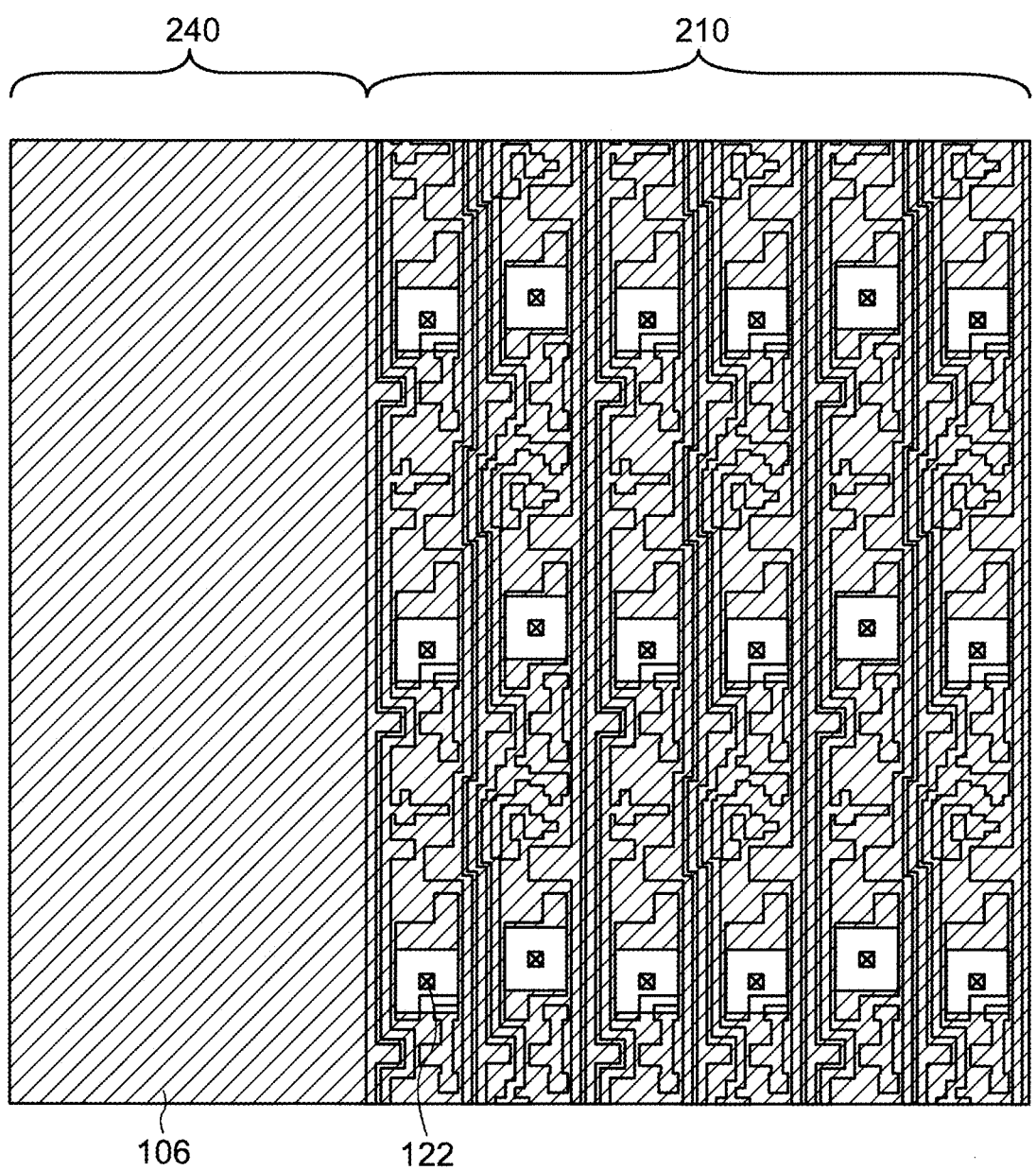
FIG. 7B is a schematic plan view showing a method for manufacturing a display device according to an embodiment of the present invention.

Next, a first flattening layer 104 is formed on the first conductive layer 102 and patterned. Further, a second conductive layer 106 is formed on the first flattening layer 104 and patterned (FIG. 7B). A first flattening layer 104 is formed in the display region 210 and the dummy region 240, and an opening 122 is formed in the display region 210. Further, a second conductive layer 106 is also formed in the display region 210 and the dummy region 240, and is patterned so as to form an opening 122 in the display region 210.

Figure 7C:
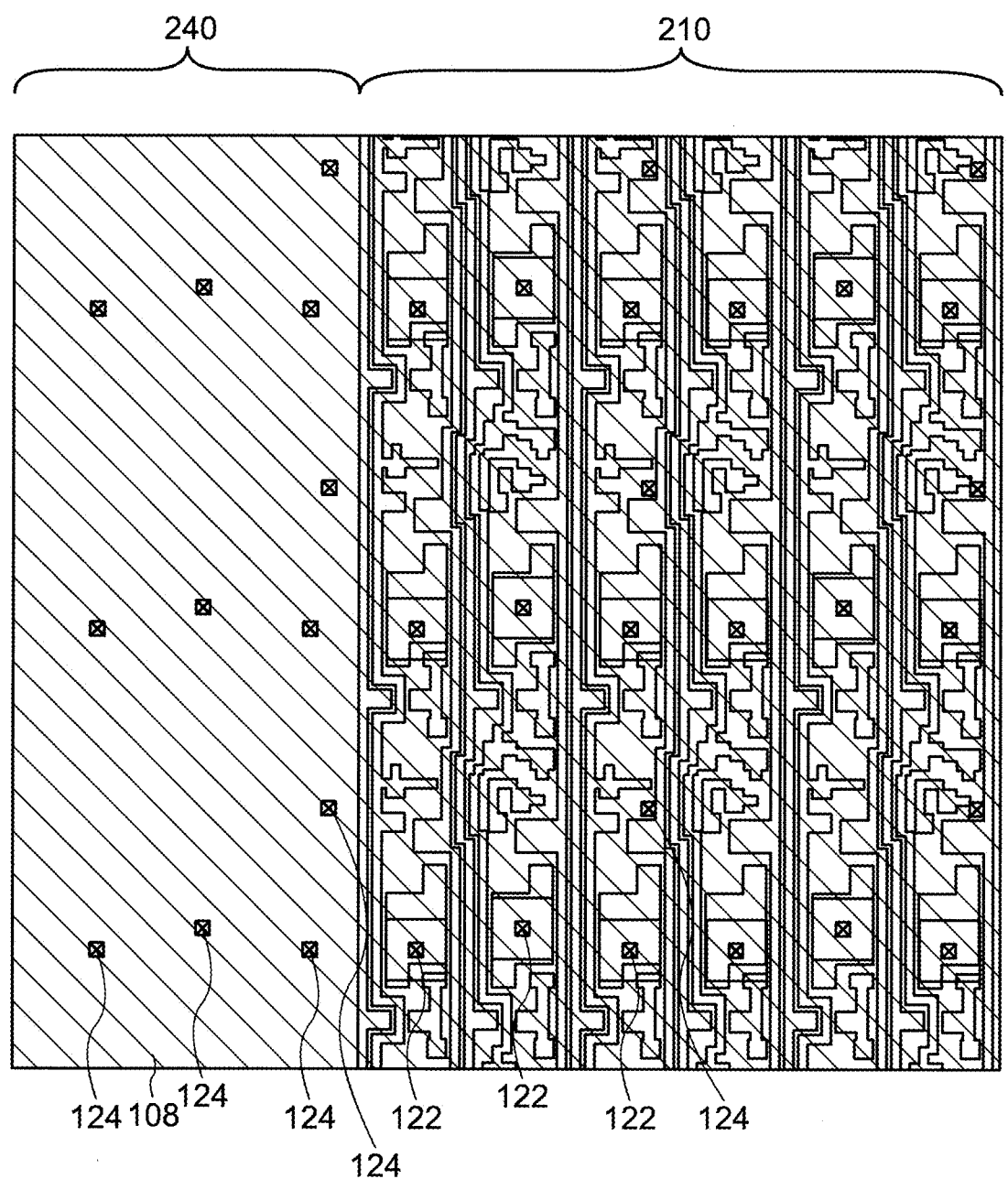
FIG. 7C is a schematic plan view showing a method for manufacturing a display device according to an embodiment of the present invention.

Next, a first insulating layer 108 is formed on the second conductive layer 106 and patterned (FIG. 7C). A first insulating layer 108 is formed in the display region 210 and the dummy region 240, and an opening 122 is formed in the display region 210 and an opening 124 is formed in the dummy region 240.

Figure 7D:
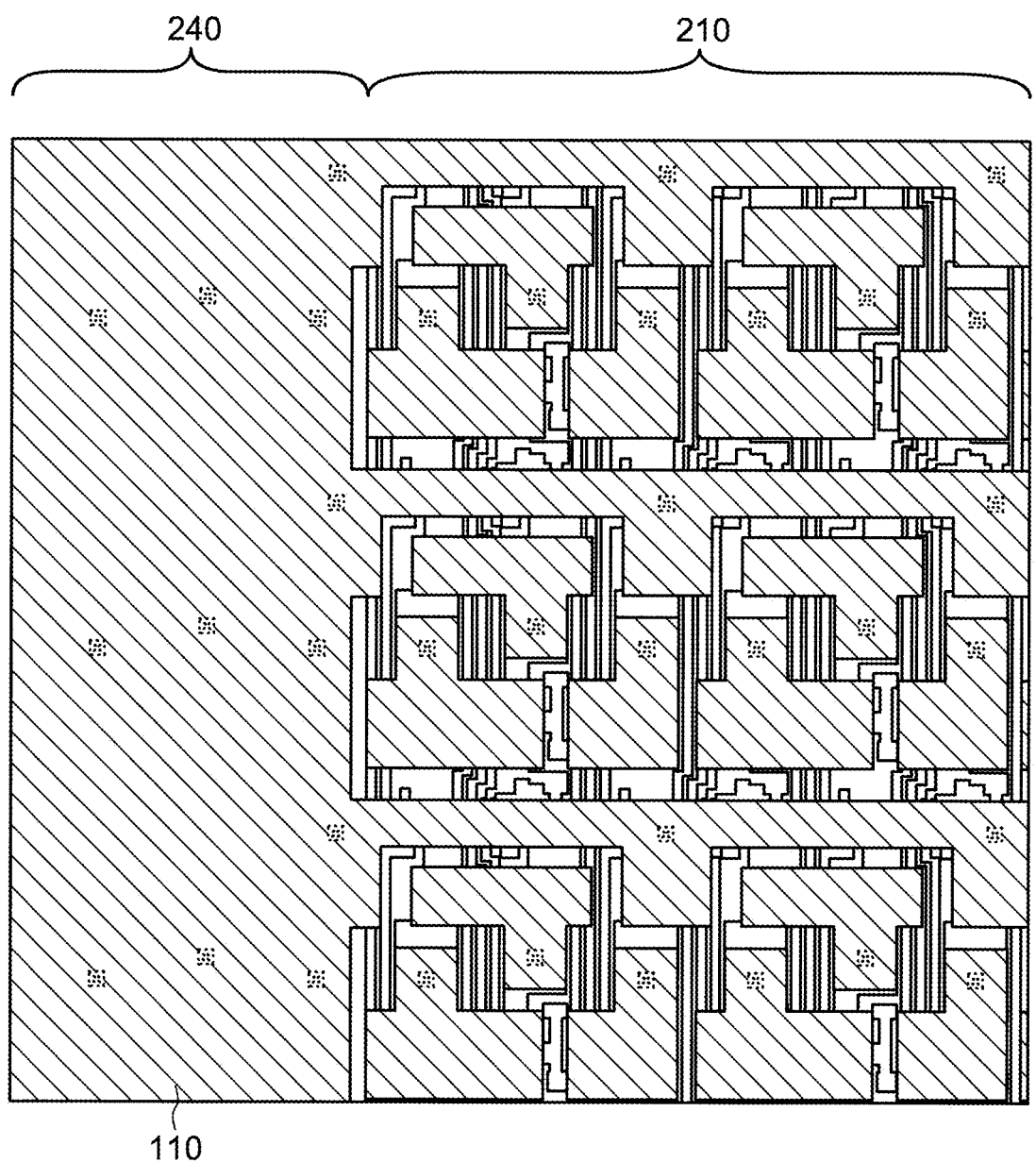
FIG. 7D is a schematic plan view showing a method for manufacturing a display device according to an embodiment of the present invention.

Next, a third conductive layer 110 is formed on the first insulating layer 108 and patterned (FIG. 7D). The third conductive layer 110 is formed in the display region 210 and the dummy region 240, and is patterned in the display region 210 so that the pixels 214 and the connection pixels 216 are defined. In the display region 210, the third conductive layer 110 is connected to the first conductive layer 102 via the opening 122. Further, in the dummy region 240, the third conductive layer 110 is connected to the second conductive layer 106 via the opening 124.

Figure 7E:
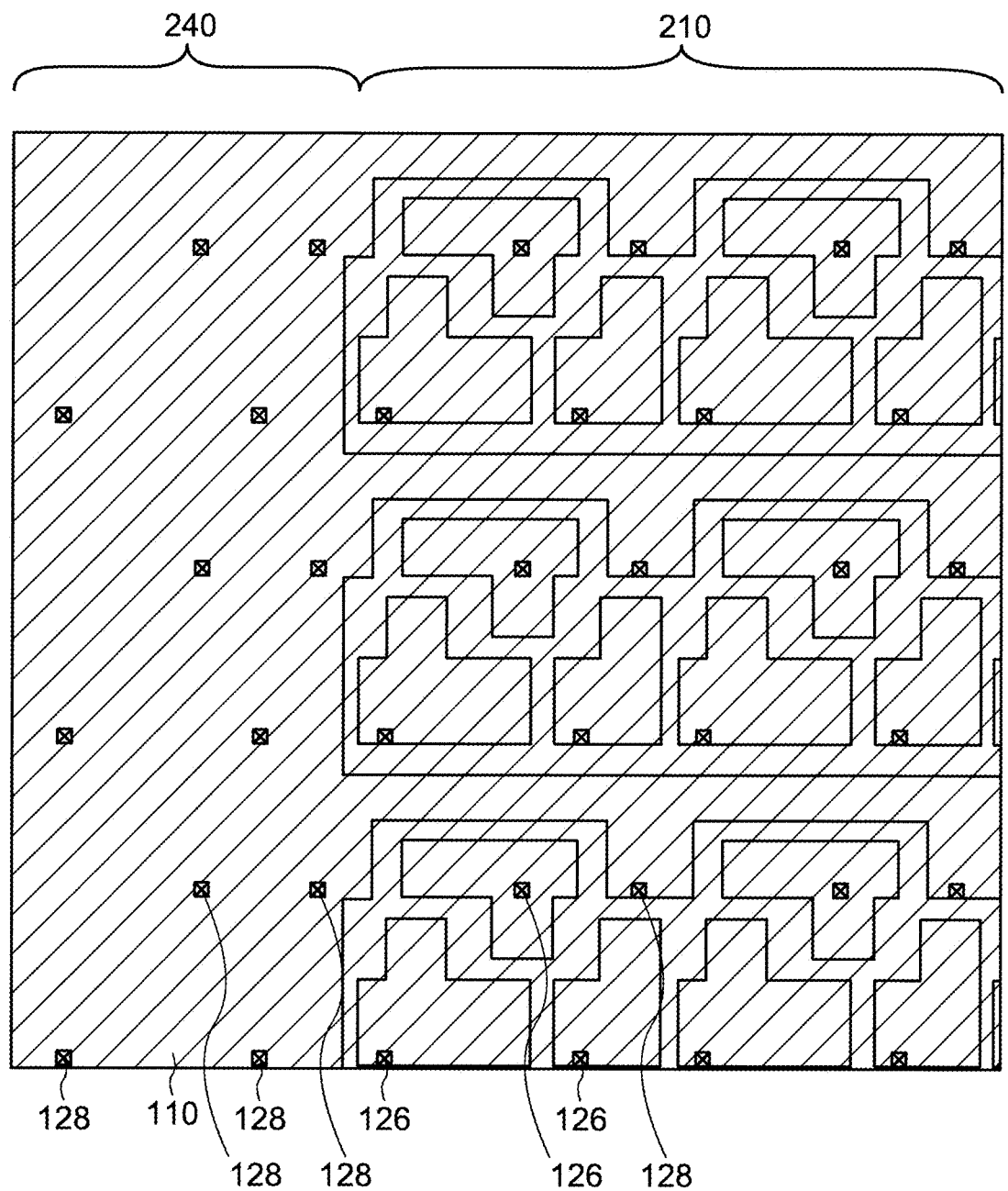
FIG. 7E is a schematic plan view showing a method for manufacturing a display device according to an embodiment of the present invention.

Next, a second flattening layer 112 is formed on the third conductive layer 110 and patterned (FIG. 7E). The second flattening layer 112 is formed in the display region 210 and the dummy region 240, and an opening 126 and an opening 128 are formed in the display region 210, and an opening 128 is formed in the dummy region 240.

Figure 7F:
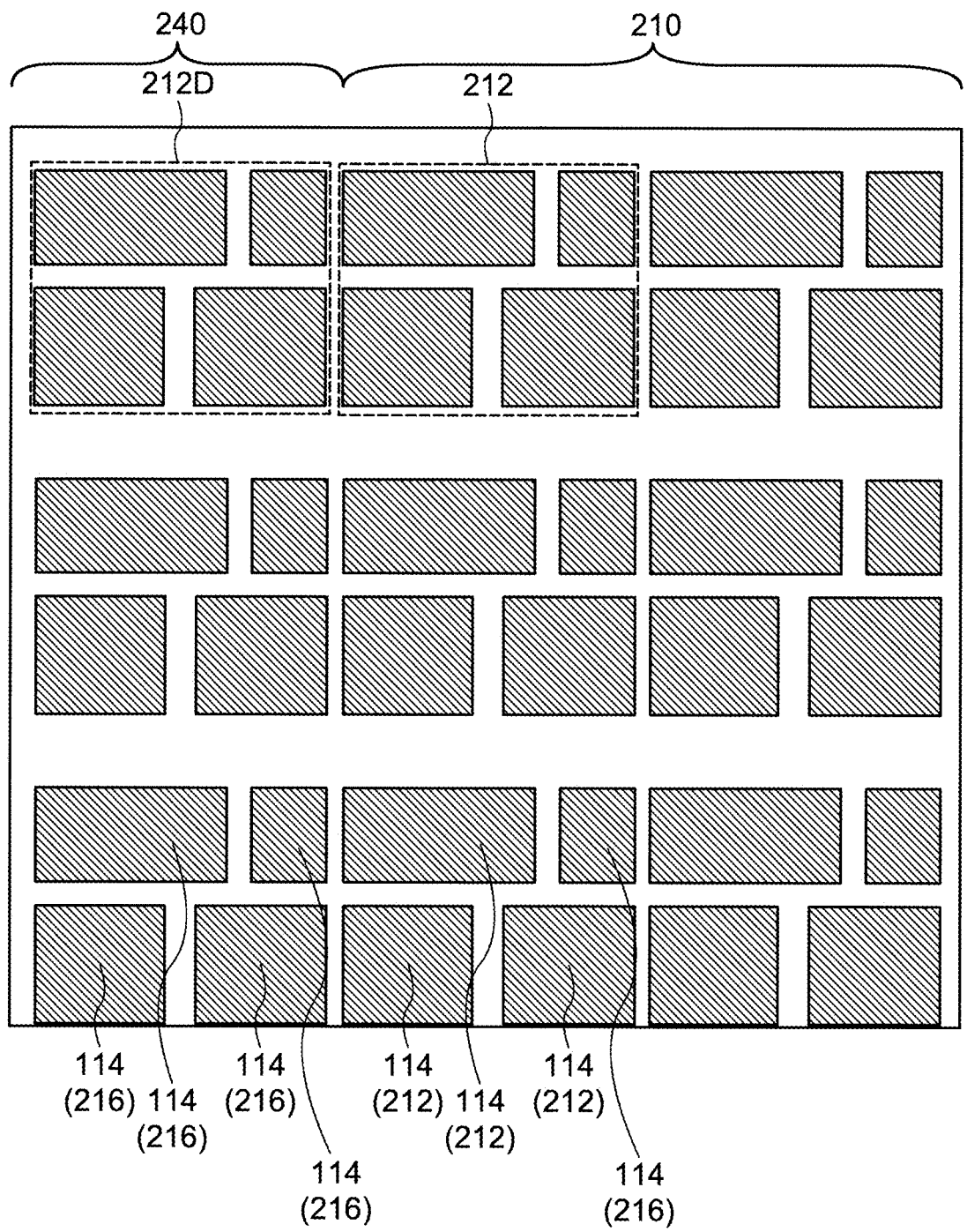
FIG. 7F is a schematic plan view showing a method for manufacturing a display device according to an embodiment of the present invention.

Next, a fourth conductive layer 114 is formed on the second flattening layer 112 and patterned (FIG. 7F). The fourth conductive layer 114 is formed in the display region 210 and the dummy region 240, and is patterned so that the pixels 214 and the connection pixels 216 are defined in the display region and the dummy region 240. In the display region 210, the fourth conductive layer 114 is connected to the third conductive layer 110 via the opening 126 or the opening 128. Further, in the dummy region 240, the fourth conductive layer 114 is connected to the third conductive layer 110 via the opening 128.

As can be seen from FIG. 7F, a pseudo pixel portion 212D similar to the pixel portion 212 of the display region 210 is formed in the dummy region 240. The pixel 214 and the connecting pixel 216 are formed in the pixel portion 212 while only the connecting pixel 216 is formed in the pseudo pixel portion 212D.

Figure 8:
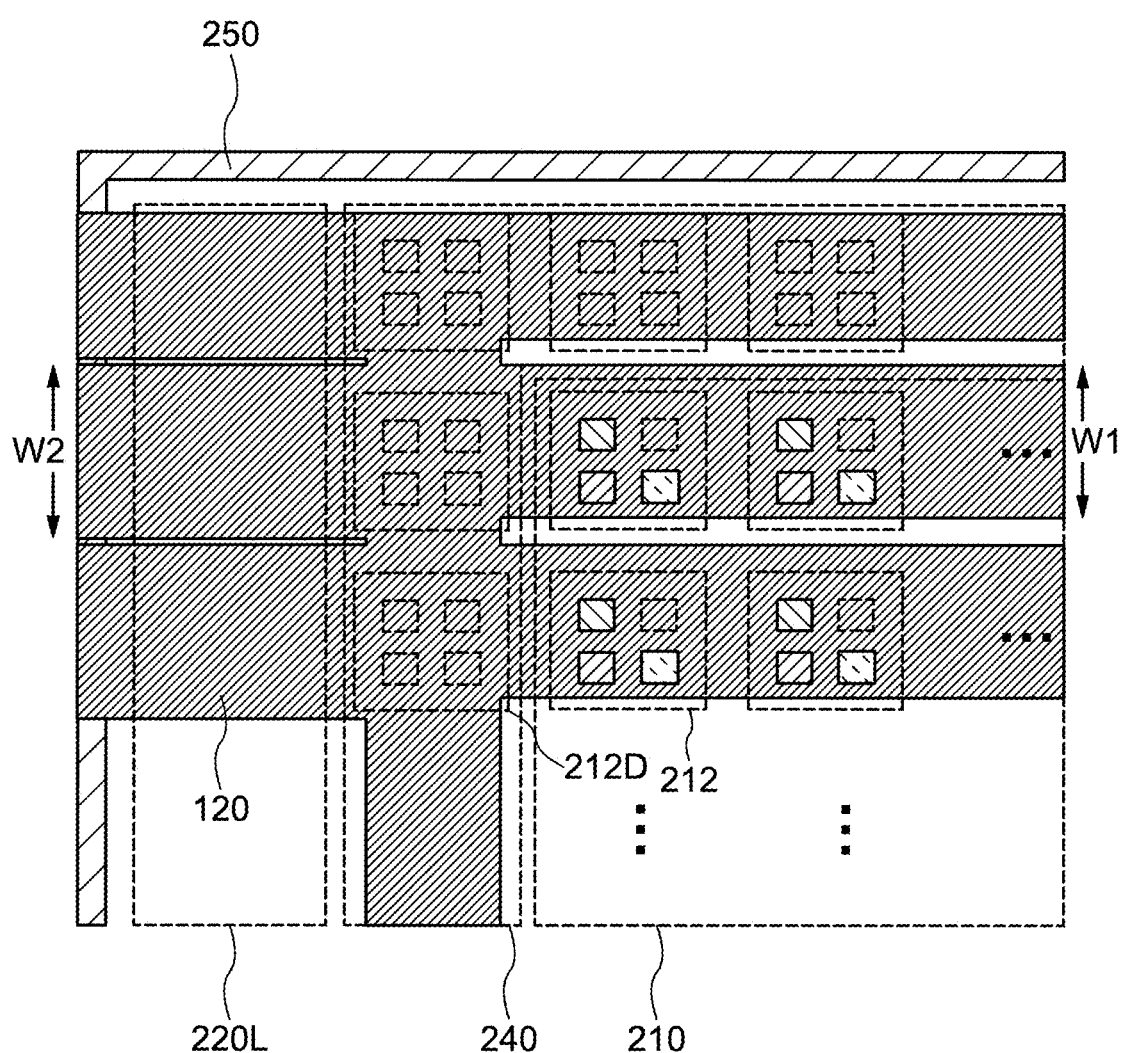
FIG. 8 is a schematic plan view explaining a pattern of a sixth conductive layer connected to a cathode connection terminal in a display device according to an embodiment of the present invention.

FIG. 8 is a schematic plan view explaining a pattern of the sixth conductive layer 120 connected to the cathode connection terminal 250 in the display device 10 according to the embodiment of the present invention.

As shown in FIG. 8, the display device 10 includes the display region 210, the dummy region 240, the first circuit region 220L, the cathode connection terminal 250, and the sixth conductive layer 120. The display region 210 includes the pixel portion 212, and the dummy region includes the pseudo pixel portion 212D. In the display device 10, the cathode connection terminal 250 is not necessarily required because the pixel portion 212 includes the connection pixel 216 which is connected to the cathode of the LED chip 218 and supplies the low power supply voltage (PVSS), but is preferably provided in order to make the current supply into the pixel portion 212 uniform. The sixth conductive layer 120 is used for connecting the cathode connection terminal 250 and the cathode of the LED chip 218. Note that although FIG. 8 shows the configuration in which the cathode connection terminal 150 is provided outside the first circuit region 220L, the position of the cathode connection terminal 150 is not limited to this.

Although the sixth conductive layer 120 may be provided in the entire surface of the display region 210 and the first circuit region 220L, the six conductive layer may be preferably formed with a certain width because a capacity becomes large and it may cause a delay in the circuit. For example, since the driving circuit and the pixel circuit are provided in the first circuit region 220L and the display region 210, the sixth conductive layer 120 in the first circuit region 220L and the display region 210 is provided so as to extend with a constant width in the direction from the first circuit region 220L to the second circuit region 220R (see FIG. 1). In other words, the sixth conductive layer 120 in the first circuit region 220L and the display region 210 has a gap. On the other hand, since the dummy region 240 is not provided with a circuit, the sixth conductive layer may be provided along the dummy region 240. In order to avoid a voltage drop due to resistance, it is preferable to increase the width of the sixth conductive layer 120 as much as possible, and it is preferable that the width of the sixth conductive layer 120 is large in the vicinity of the cathode connection terminal 250. In FIG. 8, a width W2 of the sixth conductive layer 120 in the first circuit region 220L can be made larger than a width W1 of the sixth conductive layer 120 in the display region 210.

As described above, according to the display device 10 according to the present embodiment, the pseudo pixel portion 212D similar to the pixel portion 212 of the display region 210 is formed in the dummy region 240. Although the pseudo pixel portion 212D cannot perform display, it is possible to create a situation in which the pixel portion 212 located on the outermost periphery of the display region 210 exists in the dummy region 240. Therefore, control is possible so that the electrostatic breakdown that has conventionally occurred in the pixel portion 212 located at the outermost periphery of the display region 210 is generated in the dummy region 240. Therefore, since electrostatic breakdown does not occur in the display region 210, the display device 10 suppresses defects due to electrostatic breakdown.

Second Embodiment

A display device 20 according to another embodiment of the present invention is described with reference to FIG. 9.

Figure 9:
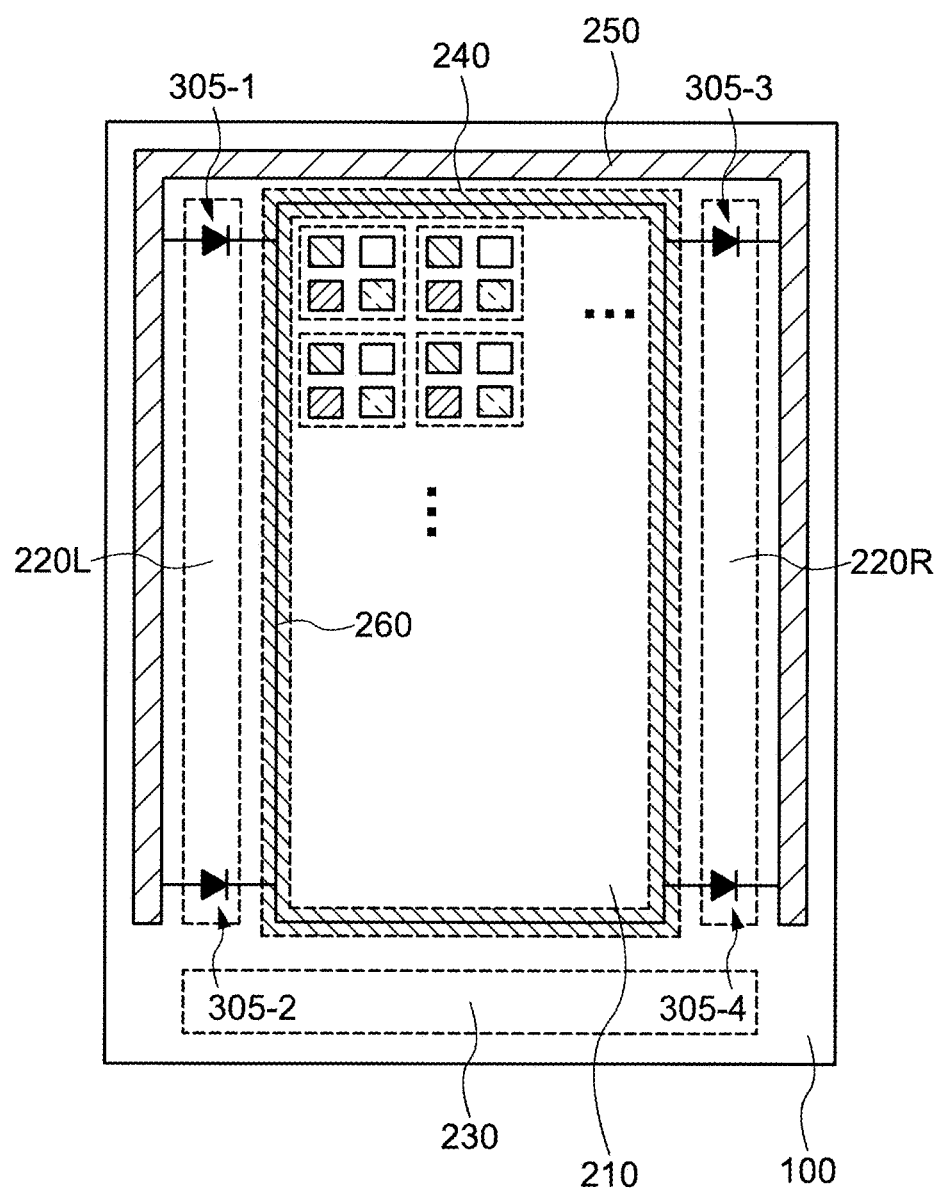
FIG. 9 is a schematic plan view of a display device according to an embodiment of the present invention.

FIG. 9 is a schematic plan view of the display device 20 according to the embodiment of the present invention. Specifically, FIG. 9 is a block diagram showing a configuration of a plan layout of the display device 20. In the following explanation, when the configuration of the display device 20 is the same as the configuration of the display device 10, the description is omitted, and the configuration different from that of the display device 10 is mainly described.

As shown in FIG. 9, the display device 20 includes a circuit substrate 100. Further, the circuit substrate 100 includes a display region 210, a first circuit region 220L, a second circuit region 220R, a connection portion 230, a dummy region 240, and a cathode connection terminal 250. The cathode connection terminal 250 is a terminal for connecting to the cathode of the LED chip 218, and is provided at a position outside the first circuit region 220L and the second circuit region 220R. Further, a guard ring 260 is provided in the dummy region 240. Specifically, the guard ring 260 is provided so as to surround the display region 210. Further, a first protection diode 305-1, a second protection diode 305-2, a third protection diode 305-3, and a fourth protection diode 305-4 connected in parallel are provided between the cathode connection terminal 250 and the guard ring 260. Specifically, the first protection diode 305-1 and the second protection diode 305-2 are connected to the cathode connection terminal 250 in the first circuit region 220L side, and the third protection diode 305-3 and the fourth protection diode 305-4 are connected to the cathode connection terminal 250 in the second circuit region 220R side. In the following explanation, when the first protection diode 305-1, the second protection diode 305-2, the third protection diode 305-3, and the fourth protection diode 305-4 are not particularly distinguished, they are referred to as a protection diode 305.

In general, the transistor 300 is not provided in the dummy region 240. Therefore, the guard ring 260 and the protection diode 305 can be formed in the lower portion of the dummy region 240 (the position below the first flattening layer 104 shown in FIG. 6). The protection diode 305 can be manufactured in the same process as the transistor 300. Further, the protection diode 306 may be a diode-connected transistor 300. Therefore, in the display device 20, the protection diode 305 can be manufactured without adding a new process.

The same applies to the guard ring 260. The transistor 300 has conductive layers of the gate electrode layer 330, the source electrode layer 370, and the drain electrode layer 380. Therefore, the guard ring 260 provided in the dummy region 240 can be formed in the same layer as any one of the gate electrode layer 330, the source electrode layer 370, and the conductive layer of the drain electrode layer 380. Further, the guard ring 260 can be formed in the same layer as the semiconductor layer 350. Therefore, in forming the guard ring 260, it is not necessary to add a new layer.

In the protection diode 305 shown in FIG. 9, a group of the first protection diode 305-1 and the second protection diode 305-2 and a group of the third protection diode 305-3 and the fourth protection diode 305-4 are connected to the cathode connection terminal 250 to have opposite diode polarities. However, the connection of the protection diode 305 is not limited to this. All protection diodes 305 may be connected to the cathode connection terminal 250 to have the same diode polarity. Further, a group of the first protection diode 305-1 and the third protection diode 305-3 and a group of the second protection diode 305-2 and the fourth protection diode 305-4 may be connected to the cathode connection terminal 250 to have opposite diode polarities. Further, the number of protection diodes 305 is not limited to four. The number of protection diodes 305 may be 3 or less, or 5 or more.

In the display device 20, the protection diode 305 may not be provided. In that case, the guard ring 260 may be electrically connected directly or indirectly to the cathode connection terminal 250.

The display device 20 according to the present embodiment includes the guard ring 260 and the protection diode 305 in the dummy region 240, and the guard ring 260 and the protection diode 305 can prevent electrostatic breakdown. Further, since the guard ring 260 and the protection diode 305 are provided in the dummy region 240, the guard ring 260 and the protection diode 305 do not interfere with the layout of the display region 210 or the circuit region 220. Further, the guard ring 260 and the protection diode 305 can be manufactured at the same time as the manufacturing process of the transistor 300, so that no new process and layer are required. Therefore, the display device 20 can be manufactured at low cost. Further, since the display device 20 has a structure in which electrostatic breakdown is unlikely to occur in the manufacturing process, it is possible to suppress the occurrence of defects in the manufacturing process of the display device 20.

Third Embodiment

A display device 30 according to another embodiment of the present invention is described with reference to FIG. 10.

Figure 10:
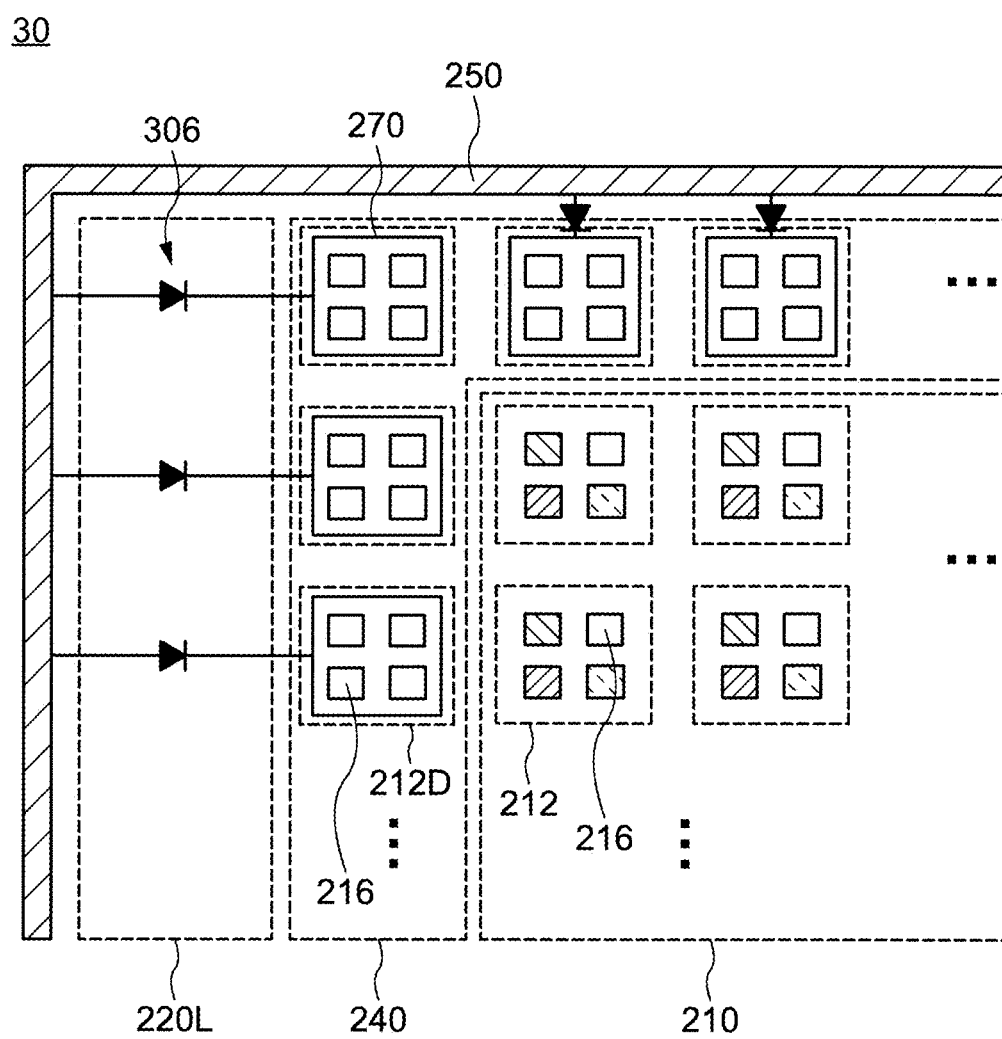
FIG. 10 is a schematic plan view of a display device according to an embodiment of the present invention.

FIG. 10 is a schematic plan view of the display device 30 according to the embodiment of the present invention. Specifically, FIG. 10 is a block diagram showing the structure of the plan layout of the corner part of the display region 210 of the display device 30. In the following explanation, when the configuration of the display device 30 is the same as the configuration of the display device 10, the description is omitted, and the configuration different from that of the display device 10 is mainly described.

As shown in FIG. 10, the display device 30 includes a display region 210, a dummy region 240, a first circuit region 220L, and a cathode connection terminal 250. The display region 210 includes a pixel portion 212, and the dummy region 240 includes a pseudo pixel portion 212D. Further, the pixel portion 212 and the pseudo pixel portion 212D include a connection pixel 216.

In the display device 30, the guard ring 270 is provided in the pseudo pixel portion 212D. Specifically, the guard ring 270 is provided so as to surround the four connection pixels 216 of the pseudo pixel portion 212D. The guard ring 270 is connected to the cathode connection terminal 250 via a protection diode 306. The protection diode 306 can be provided in the dummy region 240.

The guard ring 270 may be provided in all the pseudo pixel portions 212D in the dummy region 240, or may be provided in some pseudo pixel portions 212D.

In general, the transistor 300 is not provided in the dummy region 240. Therefore, the guard ring 270 and the protection diode 306 can be formed in the lower portion of the dummy region 240 (the position below the first flattening layer 104 shown in FIG. 6). The protection diode 306 can be manufactured in the same process as the transistor 300. Further, the protection diode 306 may be a diode-connected transistor 300. Therefore, in the display device 30, the protection diode 306 can be manufactured without adding a new process.

The same applies to the guard ring 270. The transistor 300 has conductive layers of the gate electrode layer 330, the source electrode layer 370, and the drain electrode layer 380. Therefore, the guard ring 270 provided in the dummy region 240 can be formed in the same layer as any one of the gate electrode layer 330, the source electrode layer 370, and the conductive layer of the drain electrode layer 380. Further, the guard ring 270 can be formed in the same layer as the semiconductor layer 350. Therefore, in forming the guard ring 270, it is not necessary to add a new layer.

In the display device 30, the protection diode 306 may not be provided. In that case, the guard ring 270 may be electrically connected directly or indirectly to the cathode connection terminal 250.

The display device 30 according to the present embodiment includes the guard ring 270 and the protection diode 306 in the dummy region 240, and the guard ring 270 and the protection diode 306 can prevent electrostatic breakdown. Further, since the guard ring 270 and the protection diode 306 are provided in the dummy region 240, the guard ring 270 and the protection diode 306 do not interfere with the layout of the display region 210 or the circuit region 220. Further, the guard ring 270 and the protection diode 306 can be manufactured at the same time as the manufacturing process of the transistor 300, so that no new process and layer are required. Therefore, the display device 30 can be manufactured at low cost. Further, since the display device 30 has a structure in which electrostatic breakdown is unlikely to occur in the manufacturing process, it is possible to suppress the occurrence of defects in the manufacturing process of the display device 30.

Each of the embodiments described above as an embodiment of the present invention can be appropriately combined and implemented as long as they do not contradict each other. Additions, deletion, or design changes of constituent elements, or additions, omissions, or changes to conditions of steps as appropriate based on a display device of the respective embodiments are also included within the scope of the present invention as long as the gist of the present invention is provided.

Other effects of the action which differ from those brought about by each of the above described embodiments, but which are apparent from the description herein or which can be readily predicted by those skilled in the art, are naturally understood to be brought about by the present invention.

What is claimed is:

1. A display device comprising:
a display region in which a plurality of pixel portions is arranged in a matrix on a substrate, each of the plurality of pixel portions comprising:
an LED chip;
a transistor supplying current to the LED chip; and
a capacitor,
wherein
a first electrode of the LED chip is connected to a first wiring through the transistor,
one of a high power supply voltage and a low power supply voltage is supplied to the first wiring,
a second electrode of the LED chip is connected to a second wiring to which another of the high power supply voltage and the low power supply voltage is supplied,
a first electrode of the capacitor is connected to the first electrode of the LED chip,
the plurality of pixel portions comprises at least one first pixel portion which is located on an outermost periphery of the display region and at least one second pixel portion which is not located on the outermost periphery of the display region,
a second electrode of the capacitor in the at least one first pixel portion is connected to the second wiring,
a second electrode of the capacitor in the at least one second pixel portion is connected to the first wiring,
the at least one first pixel portion comprises a plurality of first pixel portions,
the at least one second pixel portion comprises a plurality of second pixel portions,
the second electrode of the capacitor in the at least one first pixel portion is one of second electrodes of capacitors in the plurality of first pixel portions, and
the second electrodes of the capacitors in the plurality of first pixel portions are electrically connected to each other so as to surround the plurality of second pixel portions.

2. The display device according to claim 1, wherein each of the plurality of pixel portions comprises a pixel and a connection pixel,
the capacitor in the at least one first pixel portion is provided in the pixel, and
the capacitor in the at least one second pixel portion is provided in the connection pixel.

3. The display device according to claim 1, further comprising:
a circuit region provided with a drive circuit for the LED chip outside the display region; and
a guard ring between the display region and the circuit region in a plan view,
wherein
the second electrode of the capacitor of the at least one first pixel portion is electrically connected to the guard ring.

4. A display device comprising:
a display region in which an LED chip is mounted on a substrate;
a circuit region in which a drive circuit is provided outside the display region; and
in a plan view, a guard ring between the display region and the circuit region, wherein
the display region comprises a transistor connected to an anode of the LED chip,
the guard ring is provided in a same layer as a semiconductor layer or a conductive layer of the transistor, and
the guard ring is electrically connected to a cathode connection terminal connected to a cathode of the LED chip.

5. The display device according to claim 4, wherein the guard ring is provided so as to surround the display region.

6. The display device according to claim 4, wherein the cathode connection terminal is provided outside the circuit region.

7. The display device according to claim 4, wherein each of the display region and the circuit region comprises a conductive layer,
the conductive layer is electrically connected to the cathode of the LED chip and the cathode connection terminal, and
a width of the conductive layer in the circuit region is larger than a width of the conductive layer in the display region.

8. The display device according to claim 4, wherein a diode is provided between the guard ring and the cathode connection terminal.

9. The display device according to claim 4, wherein at least two diodes connected in parallel are provided between the guard ring and the cathode connection terminal, and
the at least two diodes are connected to the guard ring and the cathode connection terminal so that polarities of the at least two diodes are opposite to each other.

10. The display device according to claim 4, wherein the LED chip comprises a first electrode that is close to the substrate and a second electrode that is further from the substrate than the first electrode.

11. A display device comprising:
a display region provided with a pixel portion comprising a first pixel on which an LED chip is mounted on a substrate;
a circuit region provided with a drive circuit of the LED chip outside the display region; and
a dummy region provided with a pseudo pixel portion comprising a second pixel on which the LED chip is not mounted between the display region and the circuit region,
wherein
a guard ring is provided in the dummy region so as to surround the pseudo pixel portion,
the guard ring is electrically connected to a cathode connection terminal connected to a cathode of the LED chip, and
the cathode connection terminal is provided between the circuit region and an end portion of the substrate.

12. The display device according to claim 11, wherein each of the display region and the circuit region comprises a conductive layer, and
a width of the conductive layer in the circuit region is larger than a width of the conductive layer in the display region.

13. The display device according to claim 11, wherein a diode is provided between the guard ring and the cathode connection terminal.

14. The display device according to claim 11, wherein the display region comprises a transistor connected to an anode of the LED chip, and
the guard ring is provided in a same layer as a semiconductor layer or a conductive layer of the transistor.

15. The display device according to claim 11, wherein the LED chip comprises a first electrode which is close to the substrate and a second electrode which is further from the substrate than the first electrode.

* * * * *